United States Patent
He et al.

(10) Patent No.: US 10,672,982 B1
(45) Date of Patent: Jun. 2, 2020

(54) FABRICATION OF CORRELATED ELECTRON MATERIAL (CEM) DEVICES

(71) Applicant: Arm Limited, Cambridge (GB)

(72) Inventors: Ming He, San Jose, CA (US); Paul Raymond Besser, Sunnyvale, CA (US); Jingyan Zhang, Santa Clara, CA (US); Manuj Rathor, Fremont, CA (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/206,725

(22) Filed: Nov. 30, 2018

(51) Int. Cl.
*H01L 45/00* (2006.01)
*G11C 13/00* (2006.01)

(52) U.S. Cl.
CPC ...... *H01L 45/1616* (2013.01); *G11C 13/0007* (2013.01); *G11C 13/0069* (2013.01); *G11C 13/0097* (2013.01); *H01L 45/145* (2013.01)

(58) Field of Classification Search
CPC ............................................. H01L 45/16–1691
See application file for complete search history.

(56) References Cited

U.S. PATENT DOCUMENTS

| | | | |
|---|---|---|---|
| 7,298,640 B2 | 11/2007 | Chen et al. | |
| 7,639,523 B2 | 12/2009 | Celinska et al. | |
| 7,778,063 B2 | 8/2010 | Brubaker et al. | |
| 7,872,900 B2 | 1/2011 | Paz De Araujo et al. | |
| 8,963,114 B2 * | 2/2015 | Liao | H01L 45/04 257/2 |
| 9,231,205 B2 * | 1/2016 | Yang | H01L 45/16 |
| 9,627,615 B1 | 4/2017 | Reid et al. | |
| 9,660,189 B1 * | 5/2017 | Reid | H01L 45/085 |
| 9,997,702 B2 | 6/2018 | Reid et al. | |
| 10,002,665 B1 | 6/2018 | Bhargava et al. | |
| 2008/0107801 A1 | 5/2008 | Celinska et al. | |
| 2013/0285699 A1 | 10/2013 | Mcwilliams et al. | |
| 2014/0252295 A1 | 9/2014 | Liao et al. | |
| 2016/0163978 A1 | 6/2016 | Paz De Araujo et al. | |

(Continued)

FOREIGN PATENT DOCUMENTS

WO   2009114796 A1   9/2009
WO   2017222525 A1   12/2017

OTHER PUBLICATIONS

Notification of Transmittal of the International Search Report and the Written Opinion of the international Searching Authority, or the Declaration, App. No. PCT/GB2019/053257 Filed Nov. 15, 2019, dated Jan. 27, 2020, 1 Page.

(Continued)

*Primary Examiner* — Allison Bernstein
(74) *Attorney, Agent, or Firm* — Berkeley Law & Technology Group, LLP

(57) ABSTRACT

Subject matter disclosed herein may relate to fabrication of a correlated electron material (CEM) switch. In particular embodiments a method may include forming a structure on a first portion of a substrate while maintaining a second portion of the substrate exposed. A sealing layer may be deposited over the structure and over at least a portion of the exposed second portion of the substrate. A conductive via may be formed by way of a dry etch through the sealing layer to contact the exposed metal layer. In embodiments, an etch-stop control layer may be utilized to control an etching process prior to formation of metal contacts over the CEM switch and the conductive via.

22 Claims, 11 Drawing Sheets

(56) References Cited

U.S. PATENT DOCUMENTS

| | | |
|---|---|---|
| 2017/0213960 A1 | 7/2017 | Paz De Araujo et al. |
| 2017/0237001 A1 | 8/2017 | Reid et al. |
| 2017/0301859 A1 | 10/2017 | Paz De Araujo et al. |
| 2018/0013062 A1 | 1/2018 | Reid et al. |
| 2018/0019394 A1 | 1/2018 | Reid et al. |
| 2018/0047897 A1 | 2/2018 | Reid et al. |
| 2018/0047900 A1 | 2/2018 | Reid et al. |
| 2018/0053892 A1 | 2/2018 | Reid et al. |
| 2018/0096713 A1 | 4/2018 | Chandra et al. |
| 2018/0159028 A1 | 6/2018 | Shifren et al. |
| 2018/0159029 A1 | 6/2018 | Paz De Araujo et al. |
| 2018/0159031 A1 | 6/2018 | Paz De Araujo et al. |
| 2018/0175290 A1 | 6/2018 | Reid et al. |
| 2018/0212146 A1 | 7/2018 | Shifren et al. |
| 2019/0296236 A1* | 9/2019 | He .................... H01L 45/1675 |

OTHER PUBLICATIONS

International Search Report, App. No. PCT/GB2019/053257 Filed Nov. 15, 2019, dated Jan. 27, 2020, 5 Pages.
Written Opinion of the International Searching Authority, App. No. PCT/GB2019/053257 filed Nov. 15, 2019, dated Jan. 27, 2020, 12 Pages.

* cited by examiner

600

602

FABRICATION OF CORRELATED ELECTRON MATERIAL (CEM) DEVICES

BACKGROUND

Field

This disclosure relates to devices formed from correlated electron material (CEM), and may relate, more particularly, to approaches for fabricating CEM devices, such as may be used in switches, memory circuits, and so forth, which may exhibit desirable impedance switching characteristics.

Information

Integrated circuit devices, such as electronic switching devices, for example, may be found in numerous types of electronic devices. For example, memory and/or logic devices may incorporate electronic switches suitable for use in computers, digital cameras, smart phones, computing devices, wearable electronic devices, and so forth. Factors that may relate to electronic switching devices, which may be of interest to a designer in considering whether an electronic switching device is suitable for particular applications, may include physical size, storage density, operating voltages, impedance ranges, switching speed, and/or power consumption, for example. Other factors may include, for example, cost and/or ease of manufacture, scalability, and/or reliability.

However, conventional fabrication techniques, which may be suitable for certain types of memory and/or logic devices, may not be suited for use in fabricating devices that exhibit desired switching capabilities and/or impedance properties.

SUMMARY

Briefly, particular implementations may be directed to a method of constructing a switching device. In particular embodiments, a method may comprise forming a structure on a first portion of a substrate while maintaining a second portion of the substrate exposed, the structure comprising at least a conductive film formed on the substrate and a correlated electron material (CEM) film formed over the conductive film. The method may further comprise depositing a sealing layer over the structure and at least a portion of the second portion of the substrate and removing a portion of the sealing layer formed over the second portion of the substrate to expose a metal layer.

In another embodiment, a switching device may comprise a structure disposed or formed over a first portion of a substrate, the structure comprising at least a conductive film disposed over the substrate and a correlated electron material (CEM) film disposed over the conductive film. The switching device may additionally comprise a sealing layer disposed over the structure and at least a second portion of the substrate and a conductive via extending through a discontinuity in the sealing layer over the second portion of the substrate, the conductive via being electrically connected to the conductive film.

In another embodiment, a method may comprise using chemical mechanical polish (CMP) to polish and stop on conductive overlay on top of CEM film, followed by forming an etch-stop control layer over a device and forming a first layer of insulative filling material over the etch-stop control layer. The method may additionally comprise forming, such as by etching, a localized portion of the first layer of insulative material and terminating etching of the localized portion responsive to detection of removal of at least a portion of the etch-stop control layer.

In another embodiment, a method of coupling to switching device may comprise using chemical mechanical polish (CMP) to polish and stop on conductive overlay on top of CEM film, followed by depositing an etch-stop control layer on an insulative filling material and on a switching device adjacent to the insulative filling material. The method may additionally comprise depositing an insulative filling material, having a thickness of between about 5.0 nm to about 100.0 nm, over the etch-stop control layer. The method may additionally comprise removing at least a portion of the insulative filling material over the etch-stop control layer and terminating the removing of the at least the portion of the insulative filling material responsive to removal of at least a portion of the etch-stop control layer.

In another embodiment, a switching device may comprise a first metal contact disposed over a switching device comprising a correlated electron material and a second metal contact disposed over a via, the first and second metal contacts being coplanar; wherein at least a portion of an etch-stop control layer is disposed between the first and second metal contacts.

It should be understood that the aforementioned implementations are merely example implementations, and that claimed subject matter is not necessarily limited to any particular aspect of these example implementations.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Figure 1A:
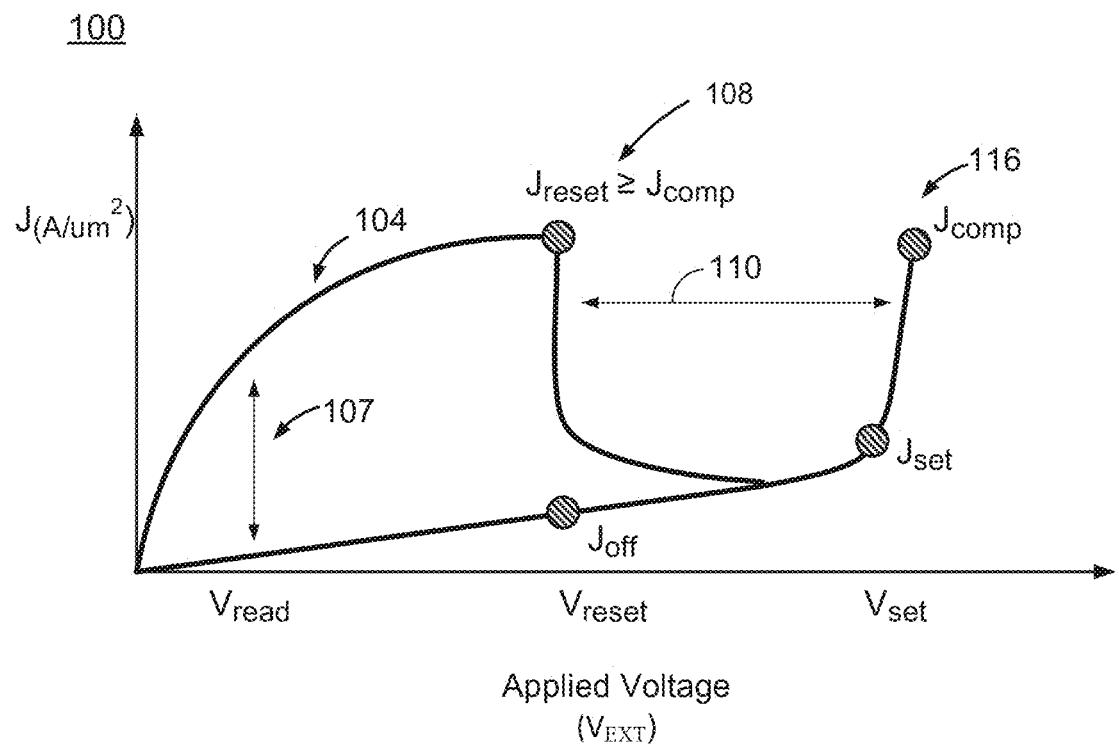
FIG. 1A is an illustration of an embodiment of a current density versus voltage profile of a device formed from a CEM.

Reference is made in the following detailed description to accompanying drawings, which form a part hereof, wherein like numerals may designate like parts throughout that are corresponding and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

DETAILED DESCRIPTION

References throughout this specification to one implementation, an implementation, one embodiment, an embodiment, and/or the like indicates that a particular feature, structure, characteristic, and/or the like described in relation to a particular implementation and/or embodiment is included in at least one implementation and/or embodiment of claimed subject matter. Thus, appearances of such phrases, for example, in various places throughout this specification are not necessarily intended to refer to the same implementation and/or embodiment or to any one particular implementation and/or embodiment. Furthermore, it is to be understood that particular features, structures, characteristics, and/or the like described are capable of being combined in various ways in one or more implementations and/or embodiments and, therefore, are within intended claim scope. In general, of course, as has been the case for the specification of a patent application, these and other issues have a potential to vary in a particular context of usage. In other words, throughout the disclosure, particular context of description and/or usage provides helpful guidance regarding reasonable inferences to be drawn; however, likewise, "in this context" in general without further qualification refers to the context of the present disclosure.

Particular aspects of the present disclosure describe methods and/or processes for preparing and/or fabricating correlated electron materials (CEMs) films to form, for example, a correlated electron switch, such as may be utilized to form a correlated electron random access memory (CERAM), and/or logic devices, for example. Correlated electron materials, which may be utilized in the construction of CERAM devices and CEM switches, for example, may also comprise a wide range of other electronic circuit types, such as, for example, memory controllers, memory arrays, filter circuits, data converters, optical instruments, phase locked loop circuits, microwave and millimeter wave transceivers, and so forth, although claimed subject matter is not limited in scope in these respects.

In this context, a CEM switch, for example, may exhibit a substantially rapid conductive-state-to-insulative-state, which may be enabled, at least in part, by electron correlations, which modify electrical properties of the material, rather than solid-state structural phase changes, such as in response to a change from a crystalline to an amorphous state, for example. Such solid-state structural phase changes, such as from crystalline to amorphous states, for example, may bring about formation of conductive filaments in certain resistive RAM devices. In one aspect, a substantially rapid conductor-to-insulator transition in a CEM device may be responsive to a quantum mechanical phenomenon that takes place within the bulk of a material, in contrast to melting/solidification or localized filament formation, for example, in phase change and certain resistive RAM devices. Such quantum mechanical transitions between relatively conductive and relatively insulative states, and/or between a first impedance state and a second, dissimilar impedance state, for example, in a CEM device may be understood in any one of several aspects. As used herein, the terms "relatively conductive state," "relatively lower impedance state," and/or "metal state" may be interchangeable, and/or may, at times, be referred to as a "relatively conductive/lower-impedance state." Likewise, the terms "relatively insulative state" and "relatively higher impedance state" may be used interchangeably herein, and/or may, at times, be referred to as a "relatively insulative/higher impedance state." Further, in a relatively insulative/higher-impedance state, a CEM may be characterized by a range of impedances, and, in a relatively conductive/lower-impedance state, a CEM may be characterized by a second range of impedances. In embodiments, the range of impedances may be significantly dissimilar to the second range of impedances.

In an aspect, a quantum mechanical transition of a CEM between a relatively insulative/higher impedance state and a relatively conductive/lower impedance state, wherein the relatively conductive/lower impedance state is substantially dissimilar from the insulative/higher impedance state, may be understood in terms of a Mott transition. In accordance with a Mott transition, a material may switch between a relatively insulative/higher impedance state to a relatively conductive/lower impedance state if a Mott transition condition occurs. The Mott criteria may be defined by $(n_c)^{1/3}$ a≈0.26, wherein $n_c$ denotes a concentration of electrons, and wherein "a" denotes the Bohr radius. If a threshold carrier concentration is achieved, such that the Mott criteria is met, the Mott transition is believed to occur. Responsive to the Mott transition occurring, the state of the CEM device changes from a relatively higher resistance/higher capacitance state (e.g., a higher-impedance/insulative state) to a relatively lower resistance/lower capacitance state (e.g., a lower-impedance/conductive state) that is substantially dissimilar from the higher resistance/higher capacitance state.

In another aspect, the Mott transition may be controlled by a localization of electrons. If carriers, such as electrons, for example, are localized, a strong coulomb interaction between the carriers may split the bands of the CEM to bring about a relatively insulative (relatively higher impedance) state. If electrons are no longer localized, a weak coulomb interaction may dominate, which may give rise to a removal of band splitting. Responsive to such band splitting, a metal may transition from a relatively conductive state to a substantially dissimilar, insulative state.

Further, in an embodiment, switching from a relatively insulative/higher impedance state to a substantially dissimilar and relatively conductive/lower impedance state may enable a change in capacitance in addition to a change in resistance. For example, a CEM device may exhibit a variable resistance together with a property of variable capacitance. In other words, impedance characteristics of a CEM device may include both resistive and capacitive components. For example, in a metal state, a CEM device may comprise a relatively low electric field that may approach zero, and thus may exhibit a substantially low capacitance, which may likewise approach zero.

Similarly, in a relatively insulative/higher impedance state, which may be brought about by a higher density of bound or correlated electrons, an external electric field may be capable of penetrating a CEM and, therefore, the CEM may exhibit higher capacitance based, at least in part, on additional charges stored within the CEM. Thus, for example, a transition from a relatively insulative/higher impedance state to a substantially dissimilar and relatively conductive/lower impedance state in a CEM device may result in changes in both resistance and capacitance, at least in particular embodiments. Such a transition may bring about additional measurable phenomena, and claimed subject matter is not limited in this respect.

In an embodiment, a device formed from a CEM may exhibit switching of impedance states responsive to a Mott-transition in a majority of the volume of the CEM comprising a CEM-based device. In an embodiment, a CEM may form a "bulk switch." As used herein, the term "bulk switch" refers to at least a substantial volume of a CEM switching a device's impedance state, such as in response to a Mott-transition. For example, in an embodiment, substantially all CEM of a device may switch between a relatively insulative/higher impedance state and a relatively conductive/lower impedance state (e.g., a "metal" or "metallic state") responsive to a Mott transition, or from a relatively conductive/lower impedance state to a relatively insulative/higher impedance state responsive to a reverse Mott transition.

In implementations, a CEM may comprise one or more "D block" elements or compounds of "D block" elements, which correspond to transition metals or transition metal oxides (TMOs). CEM devices may also be implemented utilizing one or more "F block" elements or compounds of "F block" elements. A CEM may comprise one or more rare earth elements, oxides of rare earth elements, oxides comprising one or more rare earth transition metals, perovskites, yttrium, and/or ytterbium, or any other compounds comprising metals from the lanthanide or actinide series of the periodic table of the elements, for example, and claimed subject matter is not limited in scope in this respect. A CEM may additionally comprise a dopant, such as a carbon-containing dopant and/or a nitrogen-containing dopant, wherein the atomic concentration (e.g., of carbon or nitrogen) comprise between about 0.1% to about 15.0%. As the term is used herein, a "D block" element means an element comprising scandium (Sc), titanium (Ti), vanadium (V), chromium (Cr), manganese (Mn), iron (Fe), cobalt (Co), nickel (Ni), copper (Cu), zinc (Zn), yttrium (Y), zirconium (Zr), niobium (Nb), molybdenum (Mo), technetium (Tc), ruthenium (Ru), rhodium (Rh), palladium (Pd), silver (Ag), cadmium (Cd), hafnium (Hf), tantalum (Ta), tungsten (W), rhenium (Re), osmium (Os), iridium (Ir), platinum (Pt), gold (Au), mercury (Hg), rutherfordium (Rf), dubnium (Db), seaborgium (Sg), bohrium (Bh), hassium (Hs), meitnerium (Mt), darmstadtium (Ds), roentgenium (Rg) or copernicium (Cn), or any combination thereof. A CEM formed from or comprising an "F block" element of the periodic table of the elements means a CEM comprising a metal or metal oxide, wherein the metal is from the F block of the periodic table of the elements, which may include lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), actinium (Ac), thorium (Th), protactinium (Pa), uranium (U), neptunium (Np), plutonium (Pu), americium (Am), berkelium (Bk), californium (Cf), einsteinium (Es), fermium (Fm), mendelevium (Md), nobelium (No) or lawrencium (Lr), or any combination thereof.

FIG. 1A is an illustration of an embodiment 100 of a current density (J) versus an applied voltage ($V_{EXT}$) for a device formed from a CEM. At least partially in response to a voltage applied to terminals of a CEM device, for example, during a "write operation," the CEM device may be placed into a relatively low-impedance/conductive state or a relatively high-impedance/insulative state. For example, application of a voltage $V_{set}$ and a current density $J_{set}$ may enable a transition of the CEM device to a relatively low-impedance/conductive state. Conversely, application of a voltage $V_{reset}$ and a current density $J_{reset}$ may enable a transition of the CEM device to a relatively high-impedance/insulative state. As shown in FIG. 1A, reference designator 110 illustrates the voltage range that may separate $V_{set}$ from $V_{reset}$. Following placement of the CEM device into a high-impedance state/insulative or into a low-impedance/conductive state, the particular state of the CEM device may be detected by application of a voltage $V_{read}$ (e.g., during a read operation) and detection of a current or current density at terminals of the CEM device (e.g., utilizing read window 107).

According to an embodiment, the CEM device characterized in FIG. 1A may comprise any transition metal oxide (TMO), such as, for example, perovskites, Mott insulators, charge exchange insulators, and Anderson disorder insulators, as well as any compound or material comprising a D block or F block element. In one aspect, the CEM device of FIG. 1A may comprise other types of TMO switching materials, though it should be understood that these are exemplary only and are not intended to limit claimed subject matter. Nickel oxide (NiO) is disclosed as one particular TMO material. NiO materials discussed herein may be doped with substitutional ligands, such as carbon-containing materials (e.g., carbonyl $(CO)_4$), or nitrogen-containing materials, such as ammonia ($NH_3$), for example, which may establish and/or stabilize material properties and/or enable a P-type operation in which a CEM may be more conductive when placed into a low-impedance/conductive state. Thus, in another particular example, NiO doped with substitutional ligands may be expressed as NiO:$L_x$, where $L_x$ may indicate a ligand element or compound and x may indicate a number of units of the ligand for one unit of NiO. A value of x may be determined for any specific ligand and any specific combination of ligand with NiO or with any other transition metal compound by balancing valences. Other dopant ligands, which may enable or increase conductivity in a low-impedance/conductive state in addition to carbonyl may include: nitrosyl (NO), an isocyanide (RNC wherein R is H, $C_1$-$C_6$ alkyl or $C_6$-$C_{10}$ aryl), a phosphine ($R_3P$ wherein R is $C_1$-$C_6$ alkyl or $C_6$-$C_{10}$ aryl) for example, triphenylphosphine ($PPh_3$), an alkyne (e.g., ethyne) or phenanthroline ($C_{12}H_8N_2$), bipyridine ($C_{10}H_8N_2$), ethylenediamine ($C_2H_4$ $(NH_2)_2$), acetonitrile ($CH_3CN$), fluoride (F), chloride (Cl), bromide (Br), cyanide (CN), sulfur (S), carbon (C), and others.

In this context, a "P-type" doped CEM as referred to herein means a first type of CEM comprising a particular molecular dopant that exhibits increased electrical conductivity, relative to an undoped CEM, when the CEM is operated in a relatively low-impedance/conductive state. Introduction of a substitutional ligand, such as CO and $NH_3$, may operate to enhance the P-type nature of a NiO-based CEM, for example. Accordingly, an attribute of P-type operation of a CEM may include, at least in particular embodiments, an ability to tailor or customize electrical conductivity of a CEM, operated in a relatively low-impedance/conductive state, by controlling an atomic concentration of a P-type dopant in a CEM. In particular embodiments, an increased atomic concentration of a P-type dopant may enable increased electrical conductivity of a CEM, although claimed subject matter is not limited in this respect. In particular embodiments, changes in atomic concentration or atomic percentage of P-type dopant in a CEM device may be observed in the characteristics of region 104 of FIG. 1A, as described herein, wherein an increase in P-type dopant brings about a steeper (e.g., more positive) slope of region 104 to indicate higher conductivity.

In this context, a "P-type" doped CEM as referred to herein means a first type of CEM comprising a particular molecular dopant that exhibits increased electrical conductivity, relative to an undoped CEM, while the CEM is operated in a relatively low-impedance/conductive state. Introduction of a substitutional ligand, such as CO and $NH_3$, may operate to enhance the P-type nature of a NiO-based CEM, for example. Accordingly, an attribute of P-type operation of a CEM may include, at least in particular embodiments, an ability to tailor or customize electrical conductivity of a CEM, operated in a relatively low-impedance/conductive state, by controlling an atomic concentration of a P-type dopant in a CEM. In particular embodiments, an increased atomic concentration of a P-type dopant may enable increased electrical conductivity of a CEM, although claimed subject matter is not limited in this respect. In particular embodiments, changes in atomic concentration or atomic percentage of P-type dopant in a CEM device may be observed in the characteristics of region 104 of FIG. 1A, as described herein, wherein an increase in P-type dopant brings about a steeper (e.g., more positive) slope of region 104 to indicate higher conductivity.

In another embodiment, the CEM device represented by the current density versus voltage profile of FIG. 1A, may comprise other TMO materials, such as carbon-containing ligands or nitrogen-containing ligands, though it should be understood that these are exemplary only and are not intended to limit claimed subject matter. NiO, for example, may be doped with substitutional carbon- or nitrogen-containing ligands, which may stabilize switching properties in a manner similar to stabilization switching properties responsive to use of a carbon-containing dopant species (e.g., carbonyl). In particular, NiO materials disclosed herein may include nitrogen-containing molecules of the form $C_xH_yN_z$ (wherein x≥0, y≥0, z≥0, and wherein at least x, y, or z comprise values >0) such as ammonia ($NH_3$), cyano ($CN^-$), azide ion ($N_3^-$) ethylene diamine ($C_2H_8N_2$), phen(1, 10-phenanthroline) ($C_{12}H_8N_2$), 2,2'bipyridine ($C_{10}H_8N_2$), ethylenediamine (($C_2H_4(NH_2)_2$), pyridine ($C_5H_{5N}$), acetonitrile ($CH_3CN$), and cyanosulfanides such as thiocyanate ($NCS^-$), for example. NiO switching materials disclosed herein may include members of an oxynitride family ($N_xO_y$, wherein x and y comprise whole numbers, and wherein x≥0 and y≥0 and at least x or y comprise values >0), which may include, for example, nitric oxide (NO), nitrous oxide ($N_2O$), nitrogen dioxide ($NO_2$), or precursors with an $NO_3$ ligand.

In accordance with FIG. 1A, if sufficient bias voltage is applied (e.g., exceeding a band-splitting potential) and the aforementioned Mott condition is satisfied (e.g., injected electron holes are of a population comparable to a population of electrons in a switching region, for example), a CEM device may switch between a relatively low-impedance/conductive state to a relatively high-impedance/insulative state, for example, responsive to a Mott transition. This may correspond to point 108 of the voltage versus current density profile of FIG. 1A. At, or suitably near this point, electrons are no longer screened and become localized near the metal ion. This correlation may result in a strong electron-to-electron interaction potential, which may operate to split the bands to form a relatively high-impedance/insulative material. If the CEM device comprises a relatively high-impedance/insulative state, current may be generated by transportation of electron holes. Consequently, if a threshold voltage is applied across terminals of the CEM device, electrons may be injected into a metal-insulator-metal (MIM) diode over the potential barrier of the MIM device. In certain embodiments, injection of a threshold current of electrons, at a threshold potential applied across terminals of a CEM device, may perform a "set" operation, which places the CEM device into a low-impedance/conductive state. In a low-impedance/conductive state, an increase in electrons may screen incoming electrons and remove a localization of electrons, which may operate to collapse the band-splitting potential, thereby giving rise to the low-impedance/conductive state.

In accordance with particular embodiments, current in a CEM device may be controlled by an externally applied "compliance" condition, which may be determined at least partially on the basis of an applied external current, which may be limited during a write operation, for example, to place the CEM device into a relatively high-impedance/insulative state. This externally applied compliance current may, in some embodiments, also set a condition of a current density for a subsequent reset operation to place the CEM device into a relatively high-impedance/insulative state. As shown in the particular implementation of FIG. 1A, a voltage $V_{set}$ may be applied during a write operation to give rise to a current density $J_{comp}$, such as at point 116, to place the CEM device into a relatively low-impedance/conductive state, which may determine a compliance condition for placing the CEM device into a relatively high-impedance/insulative state in a subsequent write operation. As shown in FIG. 1A, the CEM device may be subsequently placed into a low-impedance/conductive state by application of an externally applied voltage ($V_{reset}$), which may give rise to a current density $J_{reset} ≥ J_{comp}$ at a voltage referenced by 108 in FIG. 1A.

In embodiments, compliance may set a number of electrons in a CEM device that may be "captured" by holes for the Mott transition. In other words, a current applied in a write operation to place a CEM device into a relatively low-impedance/conductive memory state may determine a number of holes to be injected to the CEM device for subsequently transitioning the CEM device to a relatively high-impedance/insulative state.

As pointed out above, a reset condition may occur in response to a Mott transition at point 108. As pointed out above, such a Mott transition may give rise to a condition in a CEM device in which a concentration of electrons n approximately equals, or becomes at least comparable to, a concentration of electron holes p. This condition may be modeled according to expression (1) as follows:

$$\lambda_{TF} n^{\frac{1}{3}} = C \sim 0.26 \tag{1}$$
$$n = \left(\frac{C}{\lambda_{TF}}\right)^3$$

In expression (1), $\lambda_{TF}$ corresponds to a Thomas Fermi screening length, and C is a constant.

According to an embodiment, a current or current density in region 104 of the voltage versus current density profile shown in FIG. 1A, may exist in response to injection of holes from a voltage signal applied across terminals of a CEM device, which may correspond to P-type operation of the CEM device. Here, injection of holes may meet a Mott transition criterion for the low-impedance/conductive state to high-impedance/insulative state transition at current $I_{MI}$ as a threshold voltage $V_{MI}$ is applied across terminals of a CEM device. This may be modeled according to expression (2) as follows:

$$I_{MI}(V_{MI}) = \frac{dQ(V_{MI})}{dt} \approx \frac{Q(V_{MI})}{t} \quad (2)$$

$$Q(V_{MI}) = qn(V_{MI})$$

In expression (2), $Q(V_{MI})$ corresponds to the charged injected (holes or electrons) and is a function of an applied voltage. Injection of electrons and/or holes to enable a Mott transition may occur between bands and in response to threshold voltage $V_{MI}$, and threshold current $I_{MI}$. By equating electron concentration n with a charge concentration to bring about a Mott transition by holes injected by $I_{MI}$ in expression (2) according to expression (1), a dependency of such a threshold voltage $V_{MI}$ on Thomas Fermi screening length $\lambda_{TF}$ may be modeled according to expression (3), as follows:

$$J_{reset}(V_{MI}) = J_{MI}(V_{MI}) = \frac{I_{MI}(V_{MI})}{A_{CEM}} = \frac{q}{A_{CEM} t}\left(\frac{C}{\lambda_{TF}(V_{MI})}\right)^3$$

In expression (3), $A_{CEM}$ is a cross-sectional area of a CEM device; and make the italics) may represent a current density through the CEM device to be applied to the CEM device at a threshold voltage $V_{MI}$, which may place the CEM device into a relatively high-impedance/insulative state.

According to an embodiment, a CEM device, which may be utilized to form a CEM switch, a CERAM memory device, or a variety of other electronic devices comprising one or more correlated electron materials, may be placed into a relatively low-impedance/conductive memory state, such as by transitioning from a relatively high-impedance/insulative state, for example, via injection of a sufficient quantity of electrons to satisfy a Mott transition criteria. In transitioning a CEM device to a relatively low-impedance/conductive state, if enough electrons are injected and the potential across the terminals of the CEM device overcomes a threshold switching potential (e.g., $V_{set}$), injected electrons may begin to screen. As previously mentioned, screening may operate to unlocalize double-occupied electrons to collapse the band-splitting potential, thereby bringing about a relatively low-impedance/conductive state.

In particular embodiments, changes in impedance states of a CEM device, may be brought about by "back-donation" of electrons of compounds comprising $Ni_xO_y$ (wherein the subscripts "x" and "y" comprise whole numbers). As the term is used herein, "back-donation" refers to a supplying of one or more electrons (e.g., increased electron density) to a transition metal, transition metal oxide, or any combination thereof (e.g., to an atomic orbital of a metal), by an adjacent molecule of a lattice structure, such as a ligand or dopant. Back-donation also refers to reversible donation of electrons (e.g., an increase electron density) from a metal atom to an unoccupied π-antibonding orbital on a ligand or dopant. Back-donation may permit a transition metal, transition metal compound, transition metal oxide, or a combination thereof, to maintain an ionization state that is favorable to electrical conduction under an influence of an applied voltage. In certain embodiments, back-donation in a CEM, for example, may occur responsive to use of carbon-containing dopants, such as carbonyl $(CO)_4$, or a nitrogen-containing dopant species, such as ammonia $(NH_3)$, ethylene diamine $(C_2H_8N_2)$, or members of an oxynitride family $(N_xO_y)$, for example, which may permit a CEM to exhibit a property in which electrons are controllably, and reversibly, "donated" to a conduction band of the transition metal or transition metal oxide, such as nickel, for example, during operation of a device or circuit comprising a CEM. Back donation may be reversed, for example, in a nickel oxide material (e.g., NiO:CO or NiO:NH$_3$), thereby permitting the nickel oxide material to switch to exhibiting a substantially dissimilar impedance property, such as a high-impedance/insulative property, during device operation.

Thus, in this context, an electron back-donating material refers to a material that exhibits an impedance switching property, such as switching from a first impedance state to a substantially dissimilar second impedance state (e.g., from a relatively low impedance state to a relatively high impedance state, or vice versa) based, at least in part, on influence of an applied voltage to control donation of electrons, and reversal of the electron donation, to and from a conduction band of the CEM.

In some embodiments, by way of back-donation, a CEM switch comprising a transition metal, transition metal compound, or a transition metal oxide, may exhibit low-impedance/conductive properties if the transition metal, such as nickel, for example, is placed into an oxidation state of 2+ (e.g., Ni$^{2+}$ in a material, such as NiO:CO or NiO:NH$_3$). Conversely, electron back-donation may be reversed if a transition metal, such as nickel, for example, is placed into an oxidation state of 1+ or 3+. Accordingly, during operation of a CEM device, back-donation may result in "disproportionation," which may comprise substantially simultaneous oxidation and reduction reactions, substantially in accordance with expression (4), below:

$$2Ni^{2+} \rightarrow Ni^{1+} + Ni^{3+} \quad (4)$$

Such disproportionation, in this instance, refers to formation of nickel ions as Ni$^{1+}$+Ni$^{3+}$ as shown in expression (4), which may bring about, for example, a relatively high-impedance/insulative state during operation of the CEM device. In an embodiment, a dopant such as a carbon-containing ligand, carbonyl (CO) or a nitrogen-containing ligand, such as an ammonia molecule (NH$_3$), may permit sharing of electrons during operation of a CEM device so as to give rise to the disproportionation reaction of expression (4), and its reversal, substantially in accordance with expression (5), below:

$$Ni^{1+} + Ni^{3+} \rightarrow 2Ni^{2+} \quad (5)$$

As previously mentioned, reversal of the disproportionation reaction, as shown in expression (5), permits nickel-based CEM to return to a relatively low-impedance/conductive state.

In embodiments, depending on a molecular concentration of NiO:CO or NiO:NH$_3$, for example, which may vary from values approximately in the range of an atomic percentage of about 0.1% to about 15.0%, $V_{reset}$ and $V_{set}$, as shown in FIG. 1A, may vary approximately in the range of about 0.1 V to about 10.0 V subject to the condition that $V_{set} \geq V_{reset}$.

For example, in one possible embodiment, $V_{reset}$ may occur at a voltage approximately in the range of about 0.1 V to about 1.0 V, and $V_{set}$ may occur at a voltage approximately in the range of about 1.0 V to about 2.0 V, for example. It should be noted, however, that variations in $V_{set}$ and $V_{reset}$ may occur based, at least in part, on a variety of factors, such as atomic concentration of an electron back-donating material, such as NiO:CO or NiO:NH$_3$ and other materials present in the CEM device, as well as other process variations, and claimed subject matter is not limited in this respect.

Figure 1B:
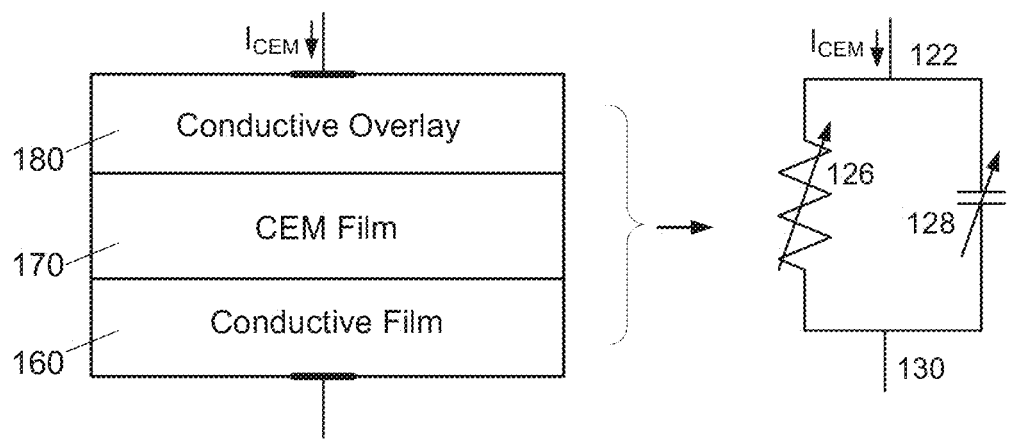
FIG. 1B is an illustration of an embodiment of a switching device comprising a CEM and a schematic diagram of an equivalent circuit of a CEM switch.

FIG. 1B is an illustration of an embodiment 150 of a switching device comprising a CEM and a schematic diagram of an equivalent circuit of a CEM switch. As previously mentioned, a correlated electron device, such as a CEM switch, a CERAM array, or other type of device utilizing one or more correlated electron materials may comprise a variable or complex impedance device that may exhibit characteristics of both variable resistance and variable capacitance. In other words, impedance characteristics for a CEM variable impedance device, such as a device comprising conductive film 160, CEM film 170, and conductive overlay 180, may depend at least in part on resistance and capacitance characteristics of the device if measured across device terminals 122 and 130. In an embodiment, an equivalent circuit for a variable impedance device may comprise a variable resistor, such as variable resistor 126, in parallel with a variable capacitor, such as variable capacitor 128. Of course, although a variable resistor 126 and variable capacitor 128 are depicted in FIG. 1B as comprising discrete components, a variable impedance device, such as device of embodiment 150, may comprise a substantially homogenous CEM film and claimed subject matter is not limited in this respect.

Table 1 below depicts an example truth table for an example variable impedance device, such as the device of embodiment 150.

TABLE 1

Correlated Electron Switch Truth Table

| Resistance | Capacitance | Impedance |
|---|---|---|
| $R_{high}(V_{applied})$ | $C_{high}(V_{applied})$ | $Z_{high}(V_{applied})$ |
| $R_{low}(V_{applied})$ | $C_{low}(V_{applied}) \sim 0$ | $Z_{low}(V_{applied})$ |

In an embodiment, Table 1 shows that a resistance of a variable impedance device, such as the device of embodiment 150, may transition between a low-impedance/conductive state and a substantially dissimilar, high-impedance/insulative state as a function at least partially dependent on a voltage applied across a CEM device. In an embodiment, an impedance exhibited at a low-impedance/conductive state may be approximately in the range of 10.0-100,000.0 times lower than an impedance exhibited in a high-impedance/insulative state. In other embodiments, an impedance exhibited at a low-impedance/conductive state may be approximately in the range of 5.0 to 10.0 times lower than an impedance exhibited in a high-impedance/insulative state, for example. It should be noted, however, that claimed subject matter is not limited to any particular impedance ratios between high-impedance/insulative states and low-impedance/conductive states. Table 1 shows that a capacitance of a variable impedance device, such as the device of embodiment 150, may transition between a lower capacitance state, which, in an example embodiment, may comprise approximately zero (or negligible) capacitance, and a higher capacitance state that is a function, at least in part, of a voltage applied across a CEM device.

In certain embodiments, atomic layer deposition may be utilized to form or to fabricate films comprising NiO materials, such as NiO:CO or NiO:NH$_3$. In this context, a "layer" as the term is used herein means a sheet or coating of material, which may be disposed on or over an underlying formation, such as a conductive or insulating substrate. For example, a layer deposited on an underlying substrate by way of an atomic layer deposition process may comprise a thickness dimension comparable to that of a single atom, which may comprise, for example, a fraction of an angstrom (e.g., 0.6 Å). However, in other embodiments, a layer may encompass a sheet or coating comprising a thickness dimension greater than that of a single atom depending, for example, on a process utilized to fabricate films comprising a CEM film. Additionally, a "layer" may be oriented horizontally (e.g. a "horizontal" layer), oriented vertically (e.g., a "vertical" layer), or may be positioned in any other orientation, such as diagonally, for example. In embodiments, a CEM film may comprise a sufficient number of layers, to permit electron back-donation during operation of a CEM device in a circuit environment, for example, to give rise to a low-impedance/conductive state. During operation in a circuit environment, for example, electron back-donation may be reversed so as to give rise to a substantially dissimilar impedance state, such as a high-impedance/insulative state, for example.

In this context, a "substrate" as used herein means a structure comprising a surface that enables materials, such as materials having particular electrical properties (e.g., conductive properties, insulative properties, etc.) to be deposited or placed on or over the substrate. For example, in a CEM-based device, conductive film 160 may operate to convey an electrical current to a CEM film in contact with conductive film 160. A conductive film, such as conductive film 160, for example, may comprise a titanium-based and/or titanium-containing material, such as titanium nitride (TiN), fabricated in layers, for example, for use in a CEM switch other type of CEM-based device. In other embodiments, conductive film 160 may comprise other types of conductive materials, such as titanium nitride, platinum, copper, aluminum, cobalt, nickel, tungsten, tungsten nitride, cobalt silicide, ruthenium oxide, chromium, gold, palladium, indium tin oxide, tantalum, silver, iridium, or any combination thereof, and claimed subject matter is not limited to any particular composition of conductive film material.

In embodiments, in which conductive film 160 comprises titanium nitride, for example, conductive film 160 may be formed utilizing precursors such as titanium tetrachloride (TiCl$_4$), which may comprise chlorine as a potential dopant species as the chlorine atoms diffuse into a CEM. In another embodiment, a TiN conductive film may be formed utilizing tetrakis dimethylamido titanium (TDMAT), tetrakis diethylamido titanium (TDEAT), and/or titanium isopropoxide (TTIP), which may comprise carbon as a dopant species as carbon atoms diffuse into the CEM. It should be noted that titanium-based and/or titanium-containing precursor materials may comprise dopant species in addition to chlorine and/or carbon and claimed subject matter is not limited in this respect. Precursors may be used with nitrogen (e.g., co-flow) as a dopant species in the form of NH$_3$.

In other embodiments, conductive film 160 may comprise a tantalum-based and/or a tantalum-containing material, such as tantalum nitride (TaN), formed in layers, for use in a CERAM device or other type of CEM-based device. In embodiments, a TaN conductive film may be formed utilizing precursors such as pentakisdimethylamido tantalum (PDMAT), which may comprise carbon as a dopant species. In another embodiment, a TaN conductive film may be formed utilizing tantalum ethoxide (TAETO), which may also comprise carbon as a dopant species. In another embodiment, a TaN conductive film may be formed utilizing tantalum pentachloride (TaCl$_5$), which may comprise chlorine as a dopant species. It should be noted that tantalum-based and/or tantalum-containing precursor materials may comprise dopant species in addition to chlorine and/or carbon and claimed subject matter is not limited in this respect. Precursors may be used with nitrogen (e.g., co-flow) as a dopant species in the form of NH$_3$.

In other embodiments, conductive film 160 may comprise a tungsten-based and/or a tungsten-containing material formed in layers, such as tungsten-nitride (WN), for example, for use in a CERAM device or other type of CEM-based device. In embodiments, a WN conductive film may be formed utilizing precursors such as tungsten hexacarbonyl (W(CO)$_6$) and/or cyclopentadienyltungsten(II) tricarbonyl hydride, both of which may comprise carbon as a dopant species. In another embodiment, a WN conductive film may be formed utilizing triamminetungsten tricarbonyl ((NH$_3$)3 W(CO)$_3$) and/or tungsten pentacarbonyl methylbutylisonitrile (W(CO)5(C$_5$H$_{11}$NC), both of which may comprise carbon or nitrogen as a dopant species. It should be noted that tungsten-based and/or tungsten precursor materials may comprise dopant species in addition to nitrogen and/or carbon and claimed subject matter is not limited in this respect. Precursors may be used with nitrogen (e.g., co-flow) as a dopant species in the form of NH$_3$.

In particular embodiments, formation of CEM films on or over a conductive film may utilize two or more precursors to deposit components of, for example, NiO:CO or NiO:NH$_3$, or other transition metal oxide, transition metal, or combination thereof, onto a conductive material such as a conductive film. In an embodiment, layers of a CEM film may be deposited utilizing separate precursor molecules, AX and BY, according to expression (6A), below:

$$AX_{(gas)} + BY_{(gas)} = AB_{(solid)} + XY_{(gas)} \qquad (6A)$$

Wherein "A" of expression (6A) corresponds to a transition metal, transition metal compound, transition metal oxide, or any combination thereof. In embodiments, a transition metal oxide may comprise nickel, but may comprise other transition metals, transition metal compounds, and/or transition metal oxides, such as aluminum, cadmium, chromium, cobalt, copper, gold, iron, manganese, mercury, molybdenum, nickel palladium, rhenium, ruthenium, silver, tantalum, tin, titanium, vanadium, yttrium, and zinc (which may be linked to an anion, such as oxygen or other types of ligands), or combinations thereof, although claimed subject matter is not limited in scope in this respect. In particular embodiments, compounds that comprise more than one transition metal oxide may also be utilized, such as yttrium titanate (YTiO$_3$).

In embodiments, "X" of expression (6A) may comprise a ligand, such as organic ligand, comprising amidinate (AMD), dicyclopentadienyl (Cp)$_2$, diethylcyclopentadienyl (EtCp)$_2$, Bis(2,2,6,6-tetramethylheptane-3,5-dionato) ((thd)$_2$), acetylacetonate (acac), bis(methylcyclopentadienyl) ((CH$_3$C$_5$H$_4$)$_2$), dimethylglyoximate (dmg)$_2$, 2-amino-pent-2-en-4-onato (apo)$_2$, (dmamb)$_2$ where dmamb=1-dimethylamino-2-methyl-2-butanolate, (dmamp)2 where dmamp=1-dimethylamino-2-methyl-2-propanolate, Bis(pentamethylcyclopentadienyl) (C$_5$(CH$_3$)$_5$)$_2$ and carbonyl (CO)$_4$. Accordingly, in some embodiments, nickel-based precursor AX may comprise, for example, nickel amidinate (Ni(AMD)), nickel dicyclopentadienyl (Ni(Cp)$_2$), nickel diethylcyclopentadienyl (Ni(EtCp)$_2$), Bis(2,2,6,6-tetramethylheptane-3,5-dionato)Ni(II) (Ni(thd)$_2$), nickel acetylacetonate (Ni(acac)$_2$), bis(methylcyclopentadienyl)nickel (Ni(CH$_3$C$_5$H$_4$)$_2$, Nickel dimethylglyoximate (Ni(dmg)$_2$), nickel 2-amino-pent-2-en-4-onato (Ni(apo)$_2$), Ni(dmamb)$_2$ where dmamb=1-dimethylamino-2-methyl-2-butanolate, Ni(dmamp)$_2$ where dmamp=1-dimethylamino-2-methyl-2-propanolate, Bis(pentamethylcyclopentadienyl) nickel (Ni(C$_5$(CH$_3$)$_5$)$_2$, and nickel carbonyl (Ni(CO)$_4$), just to name a few examples.

However, in particular embodiments, a dopant operating as an electron back-donating species in addition to precursors AX and BY may be utilized to form layers of a TMO film. An electron back-donating species, which may co-flow with precursor AX, may permit formation of electron back-donating compounds, substantially in accordance with expression (6B), below. In embodiments, a dopant species or a precursor to a dopant species, such as carbonyl (CO)$_4$, ammonia (NH$_3$), methane (CH$_4$), carbon monoxide (CO), or other precursors and/or dopant species may be utilized to provide electron back-donating ligands listed above. Thus, expression (6A) may be modified to include an additional dopant ligand comprising an electron back-donating material substantially in accordance with expression (6B), below:

$$AX_{(gas)} + (NH_3 \text{ or other ligand comprising nitrogen}) + BY_{(gas)} = AB{:}NH_{3(solid)} + XY_{(gas)} \qquad (6B)$$

It should be noted that concentrations, such as atomic concentrations, of precursors, such as AX, BY, and NH$_3$ (or other ligand comprising nitrogen) of expressions (6A) and (6B) may be adjusted to give rise to a final atomic concentration of nitrogen-containing or carbon-containing dopant to permit electron back-donation in a fabricated CEM device. As referred to herein, the term "dopant atomic concentration" means the concentration of atoms in the finished material that derive from the substitutional ligand. For example, in the case in which the substitutional ligand is CO, the atomic concentration of CO in percentage terms comprises the total number of carbon atoms that comprise the material film divided by the total number of atoms in the material film, multiplied by 100.0. In another example, for the case in which the substitutional ligand is NH$_3$, the atomic concentration of NH$_3$ comprises the total number of nitrogen atoms that comprise the material film divided by the total number of atoms in the material film, multiplied by 100.0.

In particular embodiments, nitrogen- or carbon-containing dopants may comprise ammonia (NH$_3$), carbon monoxide (CO), or carbonyl (CO)$_4$ in an atomic concentration of between about 0.1% and about 15.0%. In particular embodiments, atomic concentrations of dopants, such as NH$_3$ and CO, may comprise a more limited range of atomic concentrations such as, for example, between about 1.0% and about 15.0%. However, claimed subject matter is not necessarily limited to the above-identified precursors and/or atomic concentrations. It should be noted that claimed subject matter is intended to embrace all such precursors and atomic concentrations of dopants utilized in atomic layer deposition, chemical vapor deposition, plasma chemical vapor deposition, sputter deposition, physical vapor deposition, hot wire chemical vapor deposition, laser enhanced chemical vapor deposition, laser enhanced atomic layer deposition, rapid thermal chemical vapor deposition, spin on deposition, gas cluster ion beam deposition, or the like, utilized in fabrication of CEM devices from TMO materials. In expressions (6A) and (6B), "BY" may comprise an oxidizer, such as water ($H_2O$), oxygen ($O_2$), ozone ($O_3$), plasma $O_2$, hydrogen peroxide ($H_2O_2$). In other embodiments, "BY" may comprise CO, $O_2$+($CH_4$), or nitric oxide (NO)+water ($H_2O$) or an oxynitride or carbon-containing a gaseous oxidizing or oxynitridizing agent. In other embodiments, plasma may be used with an oxidizer (BY) to form oxygen radicals (O*). Likewise, plasma may be used with a dopant species to form an activated species to control dopant concentration in a CEM.

In particular embodiments, such as embodiments utilizing atomic layer deposition, a conductive film, such as conductive film 160, may be exposed to precursors, such as AX and BY of expression (6B), as well as dopants providing electron back-donation (such as ammonia or other ligands comprising metal-nitrogen bonds, including, for example, nickel-amides, nickel-imides, nickel-amidinates, or combinations thereof) in a heated chamber, which may attain, for example, a temperature of approximately in the range of 20.0° C. to 1000.0° C., for example, or between temperatures approximately in the range of 20.0° C. and 500.0° C. in certain embodiments. In one particular embodiment, in which atomic layer deposition of NiO:$NH_3$, for example, is performed, chamber temperature ranges approximately in the range of 20.0° C. and 400.0° C. may be utilized. Responsive to exposure to precursor gases (e.g., AX, BY, $NH_3$, or other ligand comprising nitrogen), such gases may be purged from the heated chamber for durations approximately in the range of 0.5 seconds to 180.0 seconds, for example. It should be noted, however, that these are merely examples of potentially suitable ranges of chamber temperature and/or time and claimed subject matter is not limited in this respect.

In certain embodiments, a single two-precursor cycle (e.g., AX and BY, as described with reference to expression (6A) or a single three-precursor cycle (e.g., AX, $NH_3$, $CH_4$, or other ligand comprising nitrogen, carbon, or other electron back-donating dopant derived from an substitutional ligand, and BY, as described with reference to expression (6B) utilizing atomic layer deposition may bring about a layer of a TMO material film comprising a thickness dimension approximately in the range of 0.6 Å to 5.0 Å per cycle). Accordingly, in one embodiment, if an atomic layer deposition process is capable of depositing layers of a TMO material film comprising a thickness dimension of approximately 0.6 Å, 800-900 two-precursor cycles may be utilized to bring about a TMO material film comprising a thickness dimension of approximately 500.0 Å. It should be noted that atomic layer deposition may be utilized to form TMO material films having other thickness dimensions, such as thickness dimensions approximately in the range of about 15.0 Å to about 1500.0 Å, for example, and claimed subject matter is not limited in this respect.

In particular embodiments, responsive to one or more two-precursor cycles (e.g., AX and BY), or three-precursor cycles (AX, $NH_3$, $CH_4$, or other ligand comprising nitrogen, carbon or other back-donating dopant material and BY), of atomic layer deposition, a TMO material film may be exposed to elevated temperatures, which may, at least in part, enable formation of a CEM device from a TMO material film. Exposure of the TMO material film to an elevated temperature may additionally enable activation of a back-donating dopant derived from a substitutional ligand, such as in the form of carbon monoxide, carbonyl, or ammonia, responsive to repositioning of the dopant to metal oxide lattice structures of the CEM device film.

Thus, in this context, an "elevated temperature" means a temperature at which substitutional or substitutional ligands evaporate from a TMO material film, and/or are repositioned within a TMO material film, to such an extent that the TMO material film transitions from a resistive film to a film that is capable of switching between a relatively high-impedance/insulative state to a relatively low-impedance/conductive state. For example, in certain embodiments, a TMO material film exposed to an elevated temperature within a chamber of about 100.0° C. to about 800.0° C. for a duration of about 30.0 seconds to about 120.0 minutes may permit evaporation of substitutional ligands from the TMO material film so as to form a CEM film. Additionally, in certain embodiments, a TMO material film exposed to an elevated temperature within a chamber of about 100.0° C. to about 800.0° C. for a duration of about 30.0 seconds to about 120.0 minutes may permit repositioning of substitutional ligands, for example, at oxygen vacancies within a lattice structure of a metal oxide. In particular embodiments, elevated temperatures and exposure durations may comprise more narrow ranges, such as, for example, temperatures of about 200.0° C. to about 500.0° C. for about 1.0 minute to about 60.0 minutes, for example, and claimed subject matter is not limited in these respects.

In particular embodiments, a CEM device manufactured in accordance with the above-described process may exhibit a "born on" property in which the device exhibits relatively low impedance (relatively high conductivity) immediately following fabrication of the device. Accordingly, if a CEM device is integrated into a larger electronics environment, for example, at initial activation a relatively small voltage applied to a CEM device may permit a relatively high current flow through the CEM device, as shown by region 104 of FIG. 1A. For example, as previously described herein, in at least one possible embodiment, $V_{reset}$ may occur at a voltage approximately in the range of about 0.1 V to about 1.0 V, and $V_{set}$ may occur at a voltage approximately in the range of about 1.0 V to about 2.0 V, for example. Accordingly, electrical switching voltages operating in a range of about 2.0 V, or less, may permit a memory circuit, for example, to write to a CERAM memory device, to read from a CERAM memory device, or to change state of a CERAM switch, for example. In embodiments, such relatively low voltage operation may reduce complexity, cost, and may provide other advantages over competing memory and/or switching device technologies.

In particular embodiments, two or more CEM devices may be formed within a particular layer of an integrated circuit at least in part by atomic layer deposition of a CEM. In a further embodiment, one or more of a plurality of correlated electron switch devices of a first correlated electron switch material and one or more of a plurality of correlated electron switch devices of a second correlated electron switch material may be formed, at least in part, by a combination of blanket deposition and selective epitaxial deposition. Additionally, in an embodiment, first and second access devices may be positioned substantially adjacent to first and second CEM devices, respectively.

In a further embodiment, one or more of a plurality of CEM devices may be positioned within two or more levels of an integrated circuit at one or more intersections of electrically conductive metal layers of a first level and electrically conductive metal layers of a second level, which may be positioned over the first level of conductive metal layers. In this context a "metal layer" as the term is used herein, means a conductor that routes an electrical current from a first location to a second location of a layer of a multi-level CEM switching device. For example, a conductive metal layer may transport electrical current to or from an access device located at an intersection of a conductive metal layer of first level and a conductive metal layer of the second level. In certain embodiments, fabrication of a switching device formed from a multi-level CEM device, such as devices formed utilizing conductive metal layers positioned at multiple levels of a CEM switching device may be utilized in CEM-based memory devices in which conductive metal layer positioned at multiple levels may facilitate an increase in bit line density, for example. Increases in bit line density may bring about more efficient and/or more highly integrated approaches toward controlling access to memory cells of CEM-based random access memory arrays, for example.

Additionally, in this context, a "level" as the term is used herein, means a discrete surface, which a conductive metal layer may traverse, wherein the discrete surface is separated from discrete surfaces immediately above and/or immediately below, by an insulating material. For example, as described herein, a conductive metal layer traversing a first level may be separated from a conductive metal layer traversing a second level by an insulating material, such as silicon nitride. In this context, a "multi-level" switching device, as the term is used herein, means a device to perform a switching function, such as from a high-impedance/insulative state to a low-impedance state, utilizing two or more of the above-described "levels."

As described herein, responsive to depositing one or more dopant layers on or over one or more layers of a first material, such as a transition metal, a transition metal oxide, a transition metal compound or alloy, dopant concentration of a CEM may be accurately controlled. Additionally, by depositing one or more dopant layers on or over one or more layers of a first material, localized regions of CEM may comprise differing atomic concentrations of dopants so as to provide an approach toward tailoring or customizing a dopant concentration profile. Further, dopant concentration profiles within a CEM may be increased via adjusting annealing temperatures and/or annealing durations. In addition to the above-identified advantages, particular embodiments may provide an approach toward fabricating or forming a common source electrode, which may be useful in fabricating three-dimensional structures utilized for NAND flash memory. However, claimed subject matter is not limited to the above-identified advantages.

Figure 2A:
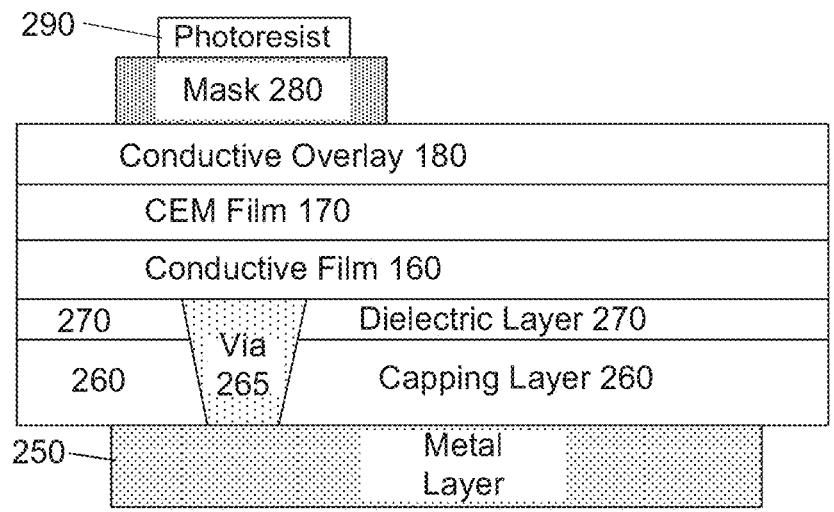
FIGS. 2A-2D illustrate sub-processes, which may be utilized to fabricate and/or construct a CEM device.

FIGS. 2A-2F illustrate sub-processes, which may be utilized to fabricate and/or construct a CEM device. In particular environments, the sub-processes of FIGS. 2A-2F may be performed during back-end-of-line integrated circuit fabrication processes, although in certain embodiments, one or more of the sub-processes of FIGS. 2A-2F may be performed during other stages of a circuit fabrication process, and claimed subject matter is not limited in this respect. In FIG. 2A, which corresponds to embodiment 200, metal layer 250, which may comprise copper or aluminum, for example, and having a thickness of between about 5.0 nm and about 500.0 nm, for example, may be deposited on or over an appropriate substrate. In one particular embodiment, metal layer 250 may comprise a level of a multilevel integrated circuit wafer fabricated during one or more previous fabrication processes. Thus, in a particular embodiment, metal layer 250 may comprise one or more first layers of a fourth metal interconnect level (M4) of a wafer fabricated over a previously fabricated third metal interconnect level (M3) of a wafer.

In particular embodiments, following formation of metal layer 250, capping layer 260 may be formed over metal layer 250, which may operate to restrict, or to preclude entirely, diffusion and/or migration of copper ions, for example, into the dielectric layer 270 of embodiment 200. Capping layer 260 may additionally operate to reduce or preclude moisture from entering from metal layer 250 of embodiment 200. Capping layer 260 may comprise a material such as silicon nitride, silicon carbon nitride or aluminum nitride, or any combination thereof, and claimed subject matter is not limited to any particular type of capping material. In particular embodiments, capping layer 260 may comprise a thickness of between about 0.5 nm and about 20.0 nm, for example, although claimed subject matter is intended to embrace capping layers comprising a variety of thicknesses, virtually without limitation.

In embodiment 200, dielectric layer 270 may be deposited on or over capping layer 260. In certain embodiments, dielectric layer 270 may comprise a thickness of between about 1.0 nm and about 50.0 nm, just as an example. Dielectric layer 270 may comprise a material such as a fluorosilicate glass having a relatively low relative dielectric constant, such as between about 3.0 and about 4.2, for example. However, in other embodiments, dielectric layer 270 may comprise a material different from fluorosilicate glass, such as, for example, fluorine-doped silicon dioxide, carbon-doped silicon dioxide, spin-on organic polymer dielectric, and so forth. In particular embodiments it may be useful for a material selected for use as a dielectric layer, such as dielectric layer 270, to be formed from a material comprising a relatively low dielectric constant, such as a dielectric constant of between 2.0 and 5.0, for example. It should be noted, however, that claimed subject matter is intended to embrace dielectric layers comprising relative dielectric constants of less 2.0, for example, as well as relative dielectric constants greater than about 5.0, for example, and claimed subject matter is not limited in this respect. Dielectric layer 270 may operate to reduce capacitive coupling, such as between metal layer 250 and conductive film 160, for example, as well as performing additional functions, and claimed subject matter is not limited in this respect.

Following formation of dielectric layer 270 and capping layer 260 on or over metal layer 250, via 265 may be formed, such as by way of an etching process followed by a metal filling process. In particular embodiments, via 265 may be formed, such as by way of an etching process, utilizing a reactive ion etching or sputter etching, just to name a few examples. Following completion of an etching process, via 265 may formed by filling an etched volume with a suitable material such as tungsten, for example, which may provide an electrically conductive path between metal layer 250 and, for example, conductive film 160. It should be noted, however, that via 265 may comprise a conductive material other than tungsten, and claimed subject matter is not limited in this respect. In particular embodiments, dielectric layer 270, via 265, and capping layer 260 may collectively be referred to as substrate 262, shown in FIGS. 3A-3C.

In embodiment 200, conductive film 160, CEM film 170, and conductive overlay 180 may be formed as described with reference to FIG. 1B herein. Conductive film 160 may be formed on or over dielectric layer 270 and/or via 265 utilizing a suitable deposition process such as, for example, atomic layer deposition, chemical vapor deposition, plasma chemical vapor deposition, sputter deposition, physical vapor deposition, hot wire chemical vapor deposition, laser enhanced chemical vapor deposition, laser enhanced atomic layer deposition, rapid thermal chemical vapor deposition, spin on deposition, gas cluster ion beam deposition, or the like, utilized in fabrication of CEM devices from TMO materials. It should be noted, however, that conductive film 160, CEM film 170, and conductive overlay 180 may be formed utilizing any other suitable process, and claimed subject matter is not intended to be limited in this respect. In a non-limiting embodiment, conductive film 160 and conductive overlay 180 may comprise iridium, platinum, ruthenium, or rhodium, just to name a few candidate materials, having thicknesses of between about 1.0 nm and about 100.0 nm, for example. Also in a nonlimiting embodiment, CEM film 170, which may comprise a thickness of between about 1.0 nm and about 100.0 nm, for example, may comprise NiO utilizing a CO dopant having a concentration of between about 0.1% and about 20.0%, for example.

Upon completion of the formation of conductive overlay 180, hardmask 280 may be deposited on or over conductive overlay 180, followed by photoresist layer 290 deposited on or over hardmask 280. In embodiment 200, hardmask 280 may comprise an oxide hardmask material such as silicon dioxide, or metallic hardmask such as titanium nitride, for example, although claimed subject matter is intended to embrace use of any hardmask material, virtually without limitation. Photoresist layer 290 may comprise any material suitable for use with a photolithographic process to form patterns in hardmask 280, for example. According to an embodiment, a reactive ion etch (RIE) process may be used to selectively etch into Mask layer 280, transferring the pattern defined by photoresist layer 290 into hardmask layer 280.

Figure 2B:
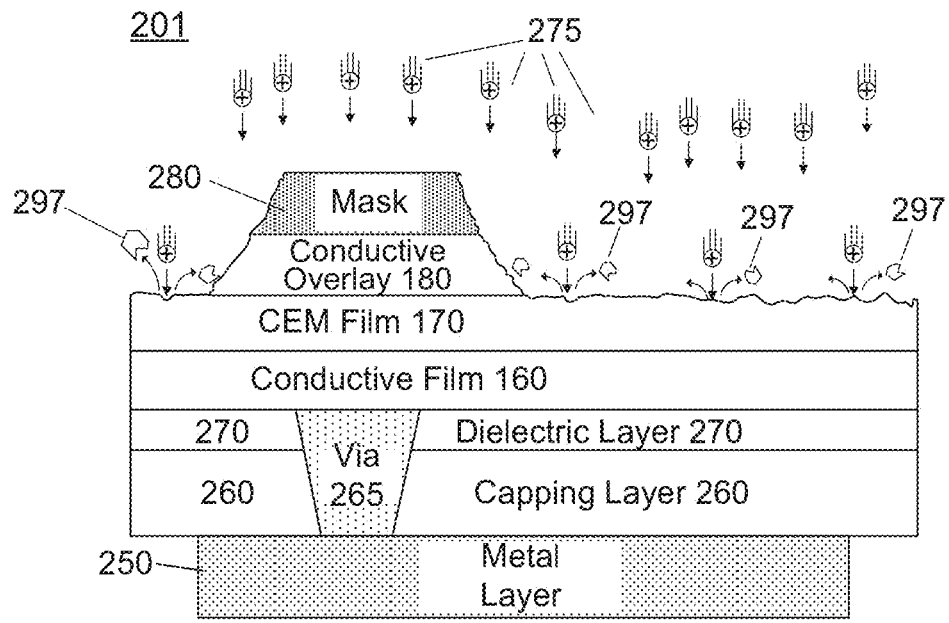

In FIG. 2B (embodiment 201), photoresist layer 290 has been removed, such as by way of a suitable solvent or other material, which may strip photoresist layer 290 from hardmask 280. In FIG. 2B, hardmask 280, conductive overlay 180, CEM film 170, and conductive film 160 may be exposed to dry etch 275 which may occur in an etching chamber. At least partially in response to the nonvolatile nature of etch byproducts from conductive overlay 180, CEM film 170, and conductive film 160, dry etch 275 may involve use of an anisotropic etching process in which an ion beam may be directed towards conductive overlay 180, CEM film 170, and/or conductive film 160. In particular embodiments, such anisotropic etching may operate to bombard one or more of conductive overlay 180, CEM film 170, and conductive film 160 with high-energy ions, which collide with atoms and/or molecules of overlay 180, film 170, and/or conductive film 160. Responsive to such collisions, particles, such as individual atoms and/or molecules, may be vaporized and removed from the etching chamber.

However, at least in particular embodiments, dry etch 275 may give rise to resputtered metallic droplets 297, which may comprise nonvolatile particles of metal and/or metal oxides, for example, dislodged from conductive overlay 180, CEM film 170, and/or conductive film 160. According to an embodiment, a sloped profile may result if the dry ion beam etch has no etch selectivity between or among hardmask 280 and layers 160/170/180. In a particular example, an edge of hardmask 280 may be faceted during etch, gradually exposing materials underneath, creating a slope profile in layers 160/170/180. A sloped profile, comprising conductive overlay 180, CEM film 170, and conductive film 160, may be in contrast to a substantially vertical profile formed via etching other types of materials, such as silicon-based materials, for example.

Figure 2C:
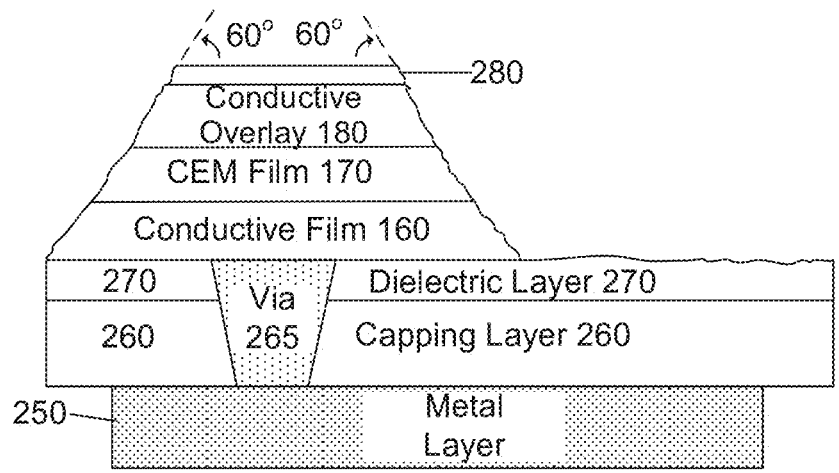
Figure 2D:
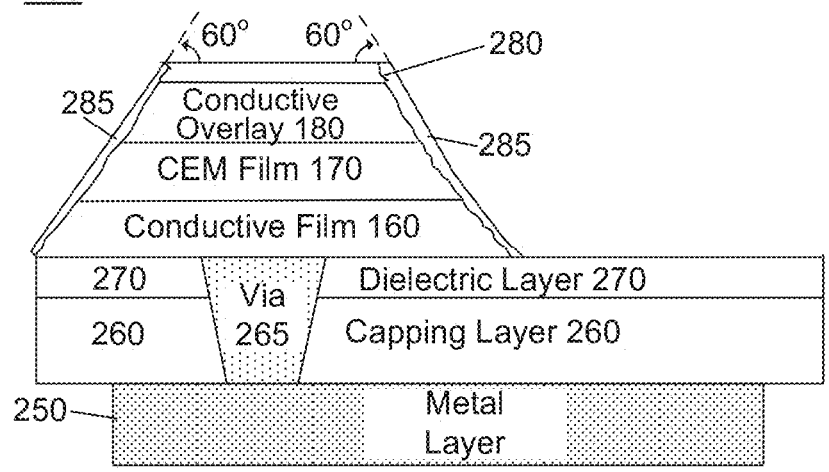

As shown in FIG. 2C (embodiment 202), following dry etch 275, hardmask 280 may be removed during the etch process step to expose sidewall portions of conductive film 160, CEM film 170 and conductive overlay 180. Alternatively, hardmask 280 may be removed in a subsequent etch process step. In a particular implementation, hardmask 280 may not necessarily be completely removed in such a subsequent etch process step, but may become thinner as a result as shown in FIGS. 2C and 2D. As shown in FIG. 2C, a sloped profile formed from conductive film 160, film 170, overlay 180 and remaining portion of hardmask 280 may approximate, for example, a 60.0° angle relative to, for example, a horizontal surface of FIG. 2C. It should be noted, however, that claimed subject matter is intended to embrace sloped profiles of a device structure comprising a wide variety of angles relative to a horizontal surface, such as angles greater than about 60.0° (e.g., angles between about 60.0° and 85.0°), as well as angles less than about 60.0°, such as angles between about 20.0° and about 60.0°.

As shown in FIG. 2D (embodiment 203), sealing layer 285 may be formed or deposited on a sloped profile of remaining portion of hardmask 280, conductive overlay 180, CEM film 170, and/or conductive film 160. In certain embodiments, sealing layer 285 may comprise an atomic or molecular concentration of at least 50.0% silicon nitride (SiN), silicon oxynitride (SiON), silicon carbon nitride (SiCN), silicon carbide (SiC) or aluminum nitride (AlN), or any combination thereof, for example. In particular embodiments, sealing layer 285 may comprise a material having a relative dielectric constant of, for example, between about 3.0 and about 10.0, for example. However, in other embodiments, sealing layer 285 may comprise a material having a dielectric constant within the range of about 2.0 to about 20.0, and claimed subject matter is not limited in this respect. Sealing layer 285 may comprise a thickness of, for example, between about 2.0 nm, and about 100.0 nm, although claimed subject matter is intended to embrace any useful thickness of sealing layer 285. In the embodiment of FIG. 2D, sealing layer 285 is shown as covering sidewall portions of remaining portion of hardmask 280, conductive overlay 180, CEM film 170 and conductive film 160 while a top surface of remaining portion of hardmask 280 is revealed or exposed. Here, in a process to forming sealing layer 285, sealing layer material may be deposited over sidewall portions of remaining portion of hardmask 280, conductive overlay 180, CEM film 170 and conductive film 160, as well as the top surface of conductive overlay 180 and portion of dielectric layer 270. A follow-on reactive ion etch (RIE) process may be used to remove portions of the sealing layer material deposited over the top surface of remaining portion of hardmask 280 and the portion of dielectric layer 270.

According to an embodiment, an RIE process used to remove sealing layer to expose 180 and 270 top surfaces may maintain sealing layer 285 at sidewall portions of remaining portion of hardmask 280, conductive overlay 180, CEM film 170 and conductive film 160 substantially intact if a slope of the sidewall portions is sufficiently steep. Accordingly, responsive to damage or degradation of sealing layer 285, subsequent fabrication processes, such as filling of regions adjacent to the device structure with, for example, insulating filling material, may bring about intrusion of moisture or other contaminants from the insulative filling material into CEM film 170, for example. Further, and also responsive to damage or degradation of sealing layer 285, certain dopants, such as low-molecular weight dopants (e.g., CO, $NH_3$, etc.) may diffuse from CEM film 170 and into an adjacent insulative filling material. Such out-diffusion of dopants from CEM film 170 as well as moisture intrusion from an adjacent insulative filling material may bring about alteration in the performance of CEM film 170, such as an ability for CEM film 170 to transition between a high-impedance insulative state to a low-impedance/conductive state, for example. Out-diffusion of dopant from CEM film 170, and moisture intrusion from adjacent insulative filling material, may bring about additional, and potentially undesirable, alterations in performance of CEM film 170, and claimed subject matter is not limited in this respect.

Figure 3A:
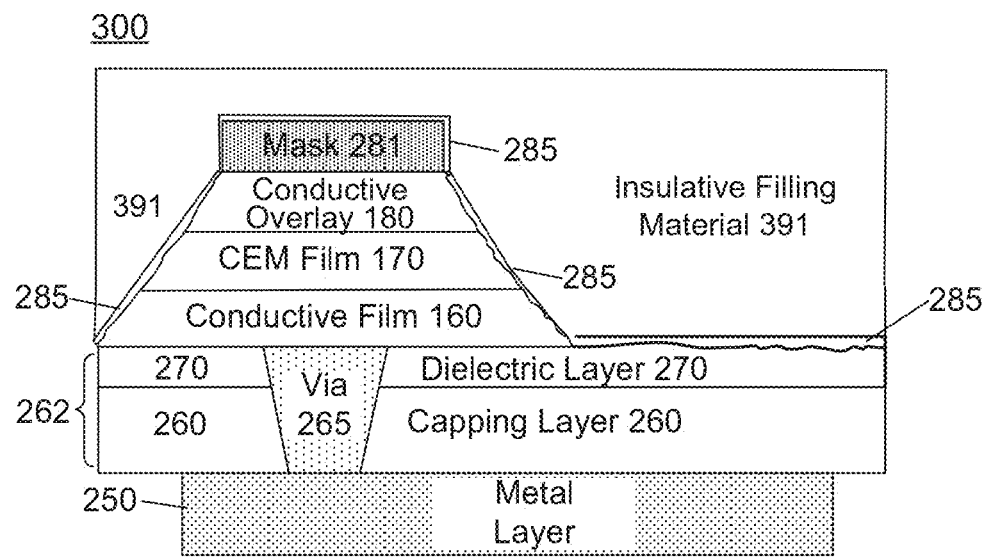
FIGS. 3A-3C illustrate sub-processes, which may be utilized to fabricate and/or construct a CEM device, according to embodiments.
Figure 3B:
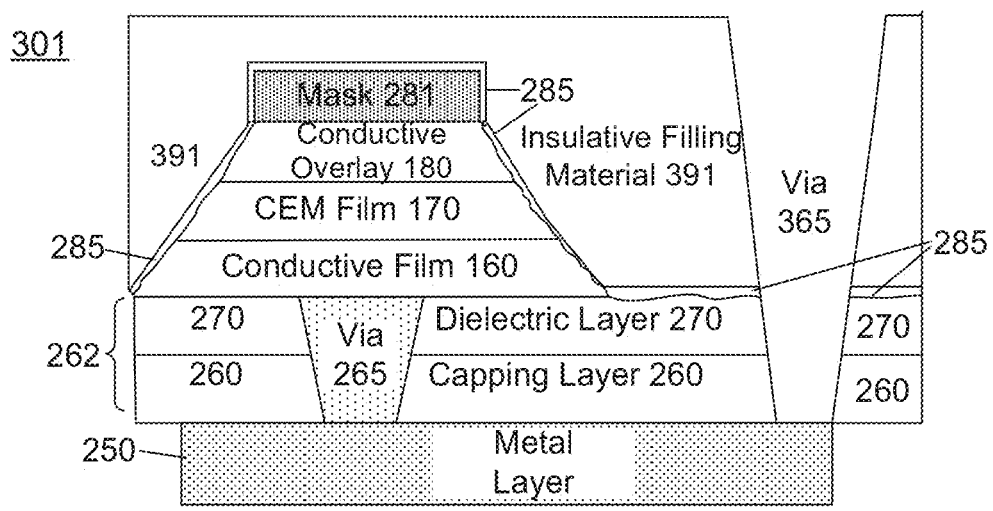
Figure 3C:
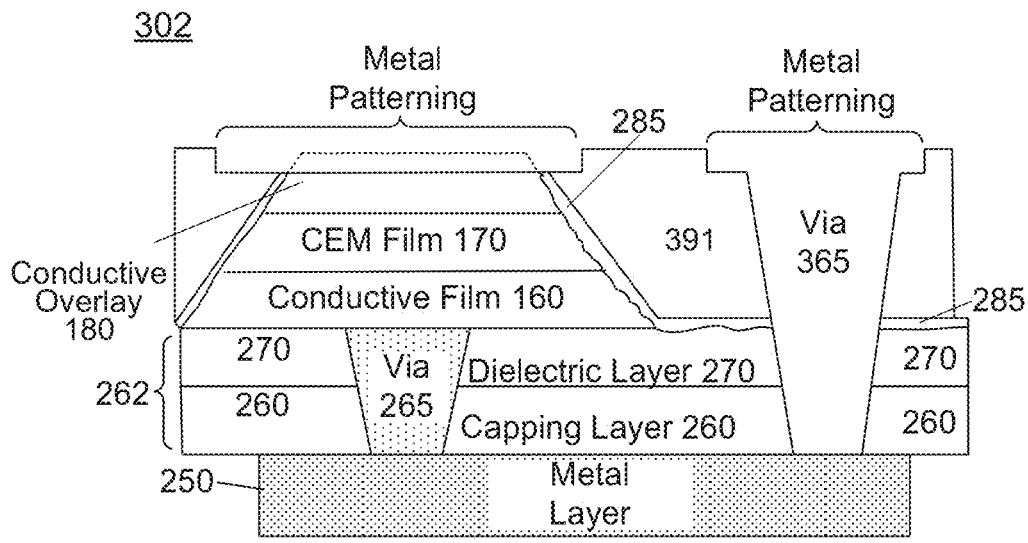

In an alternative implementation, damage to sealing layer 285 at sidewall portions of conductive overlay 180, CEM film 170 and conductive film 160 may be avoided by omitting an etch process to remove sealing layer material (e.g., removal of sealing material deposited on a surface of dielectric layer 270 in a process step to form sealing layer 285 on the sidewalls) prior to depositing an insulating material so as to reduce or eliminate damage to the sidewall portions. FIGS. 3A-3C illustrate sub-processes, which may be utilized to fabricate and/or construct a CEM device, according to embodiments. As shown in FIG. 3A (embodiment 300), insulating filling material 391 may be deposited or otherwise formed over mask 281 and the device structure formed from conductive overlay 180, CEM film 170, and conductive film 160. As mentioned previously herein, presence of sealing layer 285 may operate to seal dopants, for example, within CEM film 170. Sealing layer 285 may additionally operate to restrict, or preclude entirely, intrusion of contaminants, such as moisture, oxygen, and chemically reactive species, from insulative filling material 391. Accordingly, sealing layer 285 may bring about stability and reliability in the of CEM film 170, such as, for example, the reversible switching between a high-impedance insulative state and low-impedance/conductive state. In embodiments, insulative filling material 391 may comprise any suitable dielectric material having a dielectric constant of, for example, between about 3.0 and about 4.5. In certain embodiments, insulative filling material 391 may comprise silicon dioxide ($SiO_2$) having a dielectric constant of about 3.9. However, claimed subject matter is intended to embrace a variety of insulative filling material materials, such as $SiO_2$, silicon nitride (SiN), titanium dioxide ($TiO_2$), and so forth, virtually without limitation.

As shown in FIG. 3B (embodiment 301), via 365 may be formed, such as by way of an etching process, for example, into insulative filling material 391 as well as into sealing layer 285, dielectric layer 270, and capping layer 260 via 365 may provide a capability for conducting electrical signals between metal layer 250 and metal to be patterned on or over via 365 at a later time. In FIG. 3B, to form via 365 may comprise forming a discontinuity in sealing layer 285. In embodiments, formation of via 365 may involve a dry anisotropic etching process, such as reactive ion etching, to bring about removal of at least a portion of insulative filling material 391. A reactive ion etch may involve use of a chemically reactive plasma generated under a relatively low pressure (e.g. from about 0.0 Pa to about 10.0 kPa) by an electromagnetic field. Such generation of the chemically reactive plasma may operate to react with atomic or molecular components of insulative filling material 391, sealing layer 285, dielectric layer 270, and capping layer 260. It should be noted that reactive ion etching represents only one approach toward forming via 365, and claimed subject matter is not limited in this respect.

As shown in FIG. 3C, via 365 within insulative filling material 391 may be etched, for example, to permit deposition of metal layer patterning, which may enable electrical connection of, for example, conductive overlay 180 to external circuitry (not shown in FIG. 3C). Similarly, additional metal layer patterning on or over via 365 may enable electrical connection to external circuitry. For example, portions etched to expose or reveal conductive overlay 180 and via 365 may be filled with metal in single metal deposition step. In the embodiment of FIG. 3C, etching through a portion of insulative filling material 391, a portion of sealing layer 285, a portion of dielectric layer 270, and a capping layer 260 in a single etching step may permit connection to metal layer 250 regardless of an angle of a sloped profile of sidewall portions of one or more of conductive overlay 180, CEM film 170, and conductive film 160. In embodiments, retention of sealing layer 285 in contact with the device structure formed by the conductive overlay 180, CEM film 170, and conductive film 160 may decrease or preclude out-diffusion of dopant from, for example, CEM film 170 while precluding, or preventing intrusion of contaminants from, for example, an insulative filling material into CEM film 170. Accordingly, CEM film 170 may reliably switch between, for example, a low-impedance/conductive states and a high-impedance/insulative state, for example.

Figure 4:
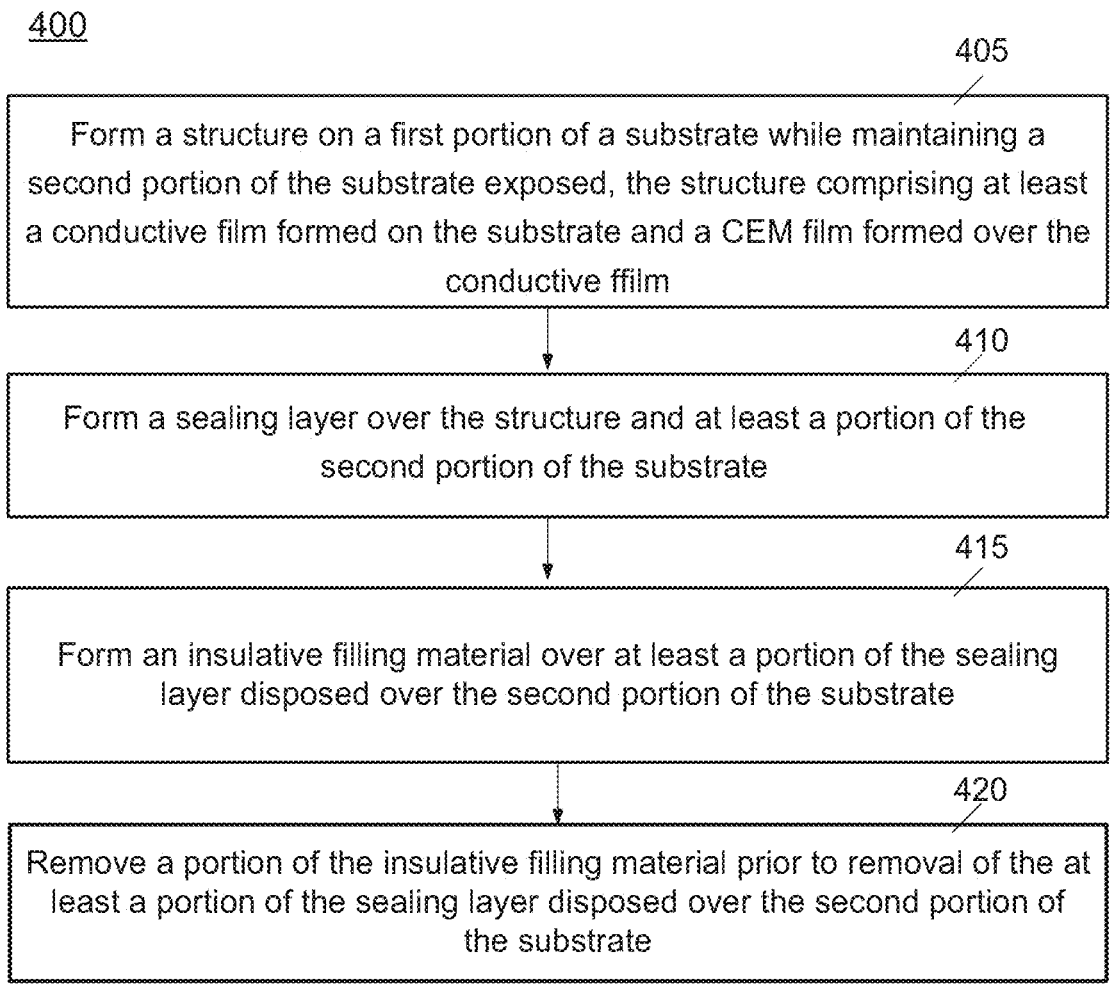
FIG. 4 is a flow diagram illustrating a process of fabricating and/or constructing a CEM switching device, according to an embodiment.

FIG. 4 is a flow diagram illustrating a process of fabricating and/or constructing a CEM switching device, according to an embodiment 400. Example implementations, such as described in FIG. 4, as well as other figures herein, may include blocks in addition to those shown and described, fewer blocks, or blocks occurring in an order different than may be identified, or any combination thereof. The method may begin at block 405, which may comprise forming a structure on a first portion of a substrate while maintaining a second portion of the substrate exposed, wherein the structure comprises at least a conductive film formed on the substrate and a CEM film formed on or over the conductive film. Thus, in particular embodiments, a structure formed at block 405 may comprise, for example, conductive film 160, CEM film 170, and conductive overlay 180, for example, formed on or over substrate 262.

The method may continue at block 410, which may comprise forming, such as by way of depositing a material, a sealing layer over the structure and over at least a portion of the second portion of the substrate. In particular embodiments, such forming or depositing of a sealing layer may comprise via chemical vapor deposition, plasma chemical vapor deposition, sputter deposition, physical vapor deposition, hot wire chemical vapor deposition, laser enhanced chemical vapor deposition, laser enhanced atomic layer deposition, rapid thermal chemical vapor deposition, spin on deposition, gas cluster ion beam deposition, or the like. Accordingly, block 410 may comprise forming or depositing sealing layer 285, which may comprise a substantial molecular or atomic concentration, such as at least about 50.0% silicon nitride (SiN), silicon oxynitride (SiON), silicon carbon nitride (SiCN), silicon carbide (SiC) or aluminum nitride (AlN), or any combination thereof, over a device structure comprising conductive overlay 180, CEM film 170, and/or conductive film 160. Block 415 may comprise forming a layer of an insulative filling material over at least a portion of the sealing layer formed at block 410. For example, block 415 may comprise depositing insulative filling material 391 over mask 280 and sealing layer 285 as shown in FIG. 3A. Block 420 may comprise removal of a portion of the layer of insulative filling material formed at block formed at block 415 prior to removal of the at least a portion of the sealing layer formed at block 410. For example, to form via 365 in an etch process, the etch process may remove a portion of insulative filling material 391 prior to removal of a portion of sealing layer 285 disposed under the removed portion of the insulative filling material 391 in a single etch step. By removing a portion of the layer of insulative filling material prior to removal of a portion of the sealing layer (disposed underneath the removed portion of the layer of insulative filling material) in a single etch process step, a separate etch step to remove portions a sealing layer (e.g., portion of sealing layer 285 disposed over dielectric layer 270) may be avoided. As pointed out above, avoiding such a separate etch step to remove portions a sealing layer may avoid or reduce damage to a portion of the sealing layer formed on sidewalls of a switching device. A via formed in part by removal of insulative filling material at block 420 may subsequent filled with a metal to be in contact with a metal layer disposed beneath the sealing layer.

Figure 5A:
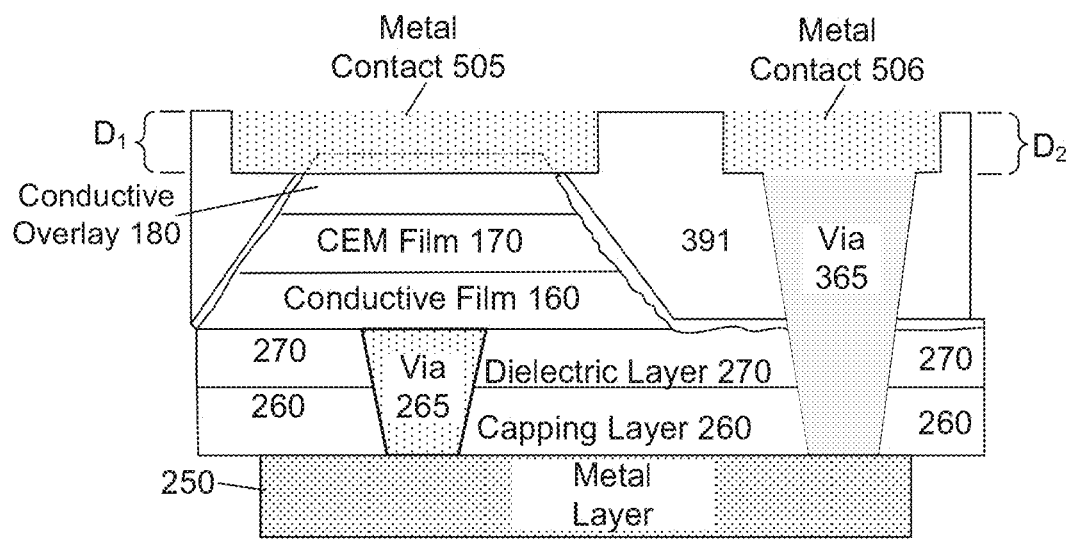
FIGS. 5A-5C illustrate sub-processes, which may be utilized to fabricate and/or construct a CEM device, according to embodiments.
Figure 5B:
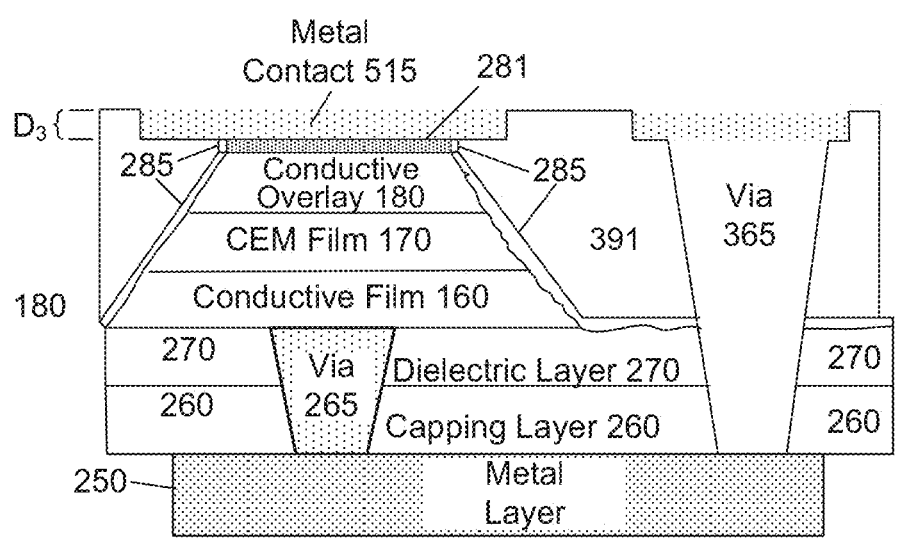
Figure 5C:
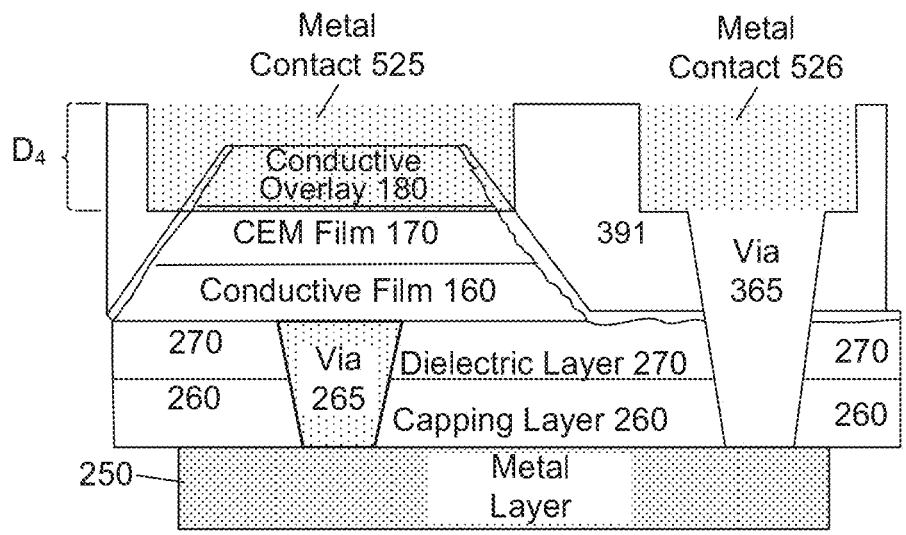

FIGS. 5A-5C illustrate sub-processes, which may be utilized to fabricate and/or construct a CEM device, according to embodiments. As shown in FIG. 5A (embodiment 500), which may follow from the etching of via 365 within insulative filling material 391, an appropriate metal may be deposited within via 365. In embodiments, via 365 comprise a suitable metal such as tungsten, for example, which may provide an electrically conductive path to metal layer 250. It should be noted, however, that via 265 may comprise a conductive material other than tungsten, and claimed subject matter is not limited in this respect. Following forming or depositing of metal to form via 365, metal contact 506 may be patterned on or over via 365, which may enable electrical connection of conductive overlay 180 to external circuitry, not shown in FIG. 5A. Likewise, metal contact 505 may be patterned on conductive overlay 180. In particular embodiments, metal contacts 505 and 506 may comprise copper or aluminum, for example, although claimed subject matter is not limited to use of any particular metal to form metal contacts 505/506.

It may be appreciated that performing an etching process, such as a dry etch, for example, to bring about contact between metal contact 505 and conductive overlay 180 may be problematic as shown in FIGS. 5B and 5C. In particular embodiments, to obtain a relatively low-impedance electrical connection between metal contact 505 and conductive overlay 180, insulative filling material 391 may be etched, for example, to a relatively precise depth, such as indicated by $D_1$.

As shown in FIG. 5B (embodiment 501), responsive to etching of insulative filling material 391 to a depth less than, for example, $D_1$ of FIG. 5A may result in metal contact 515 being unable to form an electrical connection with conductive overlay 180. Accordingly, under such open-circuit conditions, in which etch depth $D_3$ comprises a depth insufficient to form an electrical connection with conductive overlay 180, external circuitry (not shown in FIG. 5B) may be unable to exert control, for example, over the device structure formed by conductive overlay 180, CEM film 170, and conductive film 160. Conversely, as shown in FIG. 5C (embodiment 502), responsive to over etching, in which an etch process brings about an etching a way of a substantial portion of conductive overlay 180, metal contact 525 may be brought into direct contact with CEM film 170. In particular embodiments, such as embodiments in which metal contact 525 comprises, for example, copper metal, direct contact between metal contact 525 and CEM film 170 may bring about intrusion of copper metal ions into CEM film 170. Under such circumstances, exposure of CEM film 170 to copper metal may degrade impedance performance parameters of CEM film 170, jeopardize reliability, and/or bring about additional undesirable consequences. I In addition, etching (e.g., to remove insulative filling 391) can damage CEM film 170 directly.

Figure 6A:
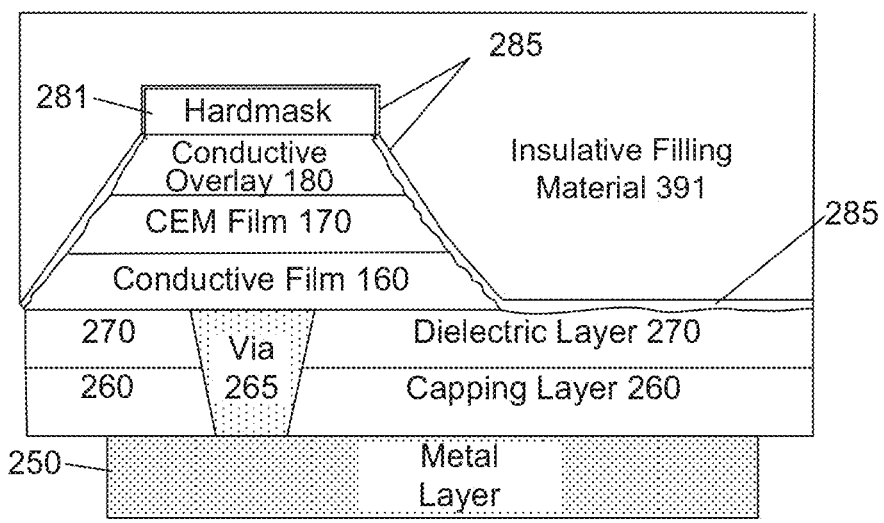
FIGS. 6A-6G illustrate sub-processes utilizing an etch-stop control layer to fabricate and/or construct a CEM device, according to embodiments.
Figure 6B:
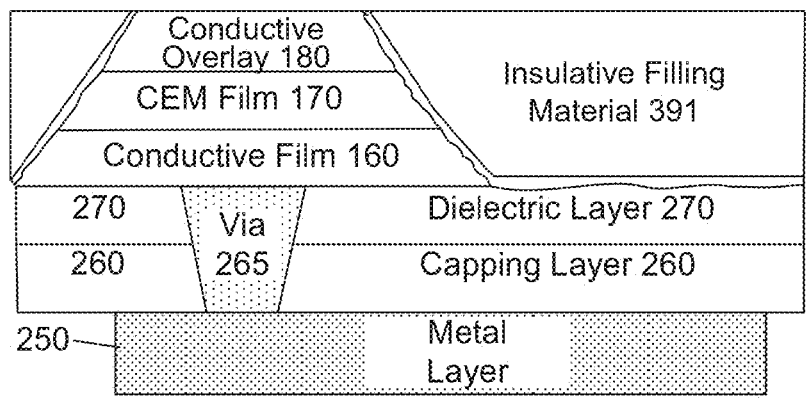

FIGS. 6A-6G illustrate sub-processes utilizing an etch-stop control layer to fabricate and/or construct a CEM device, according to embodiments. As shown in FIG. 6A (embodiment 600), which may resemble FIG. 3A in some aspects, insulative filling material 391 may be deposited, for example, adjacent and over hardmask 281, conductive film 160, CEM film 170, and conductive overlay 180. Additionally, sealing layer 285 may function to protect CEM film 170 from moisture intrusion from insulative filling material 391 as well as restrict, or preclude entirely, out-diffusion of dopant to insulative filling material 391. As shown in FIG. 6B (embodiment 601), following forming or depositing sealing layer 285 on or over a top portion of hardmask 281, chemical mechanical polishing/planarization may be performed, which may remove sealing material and hardmask 281 formed on a top (e.g., horizontal in FIG. 2D) surface of conductive overlay 180.

Figure 6C:
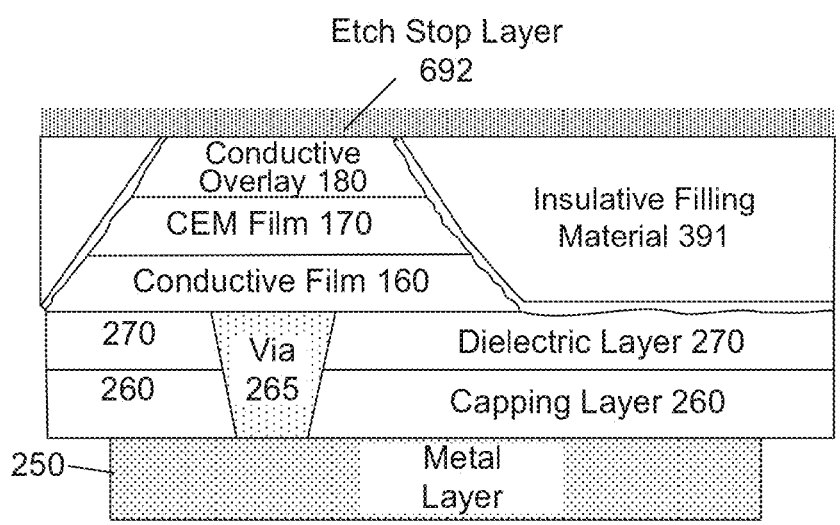

As shown in FIG. 6C (embodiment 602), etch-stop control layer 692 may be formed or deposited on or over insulative filling material 391. In embodiments, depositing etch-stop control layer 692 may comprise use of chemical vapor deposition, plasma chemical vapor deposition, sputter deposition, physical vapor deposition, hot wire chemical vapor deposition, laser enhanced chemical vapor deposition, laser enhanced atomic layer deposition, rapid thermal chemical vapor deposition, spin on deposition, gas cluster ion beam deposition, or the like. In this context, an etch-stop control layer may be defined as a material which, as shown further in relation to FIG. 6F, operates to indicate dissociation or vaporization of itself by way of a sensor or other detector that samples the environment of an etching chamber. Accordingly, as described in relation to FIG. 6F, for an etch-stop control layer 692 comprising at least a substantial atomic or molecular concentration, such as at least 50.0%, of aluminum nitride (AlN), presence of gaseous and/or dissociated aluminum in an etching chamber may be detected by a chemical sensor. Detection of gaseous and/or dissociated aluminum may be utilized to control or even terminate a dry etching process. In another embodiment, if etch-stop control layer 692 comprises at least a substantial atomic or molecular concentration, such as at least 50.0%, of silicon nitride (SiN), presence of gaseous and/or dissociated silicon nitride in an etching chamber may be detected by a chemical sensor. Detection of gaseous and/or dissociated silicon and/or nitrogen may be utilized to slow or terminate a dry etching process. It should be noted that claimed subject matter is not limited to etch-stop control layers comprising AlN and SiN. Rather, claimed subject matter is intended to embrace a wide variety of etch-stop control layers. Etch-stop control layer 692 may comprise any thickness suitable to provide an indication that a dry etch process, such as a reactive ion etch, for example, has penetrated an upper or top surface so as to initiate vaporization of the etch-stop control layer. Accordingly, etch-stop control layer 692 may comprise a thickness of, for example, between about 1.0 nm and about 50.0 nm, although particular embodiments may utilize an etch-stop control layer greater than 50.0 nm, and claimed subject matter is not limited in this respect.

Figure 6D:
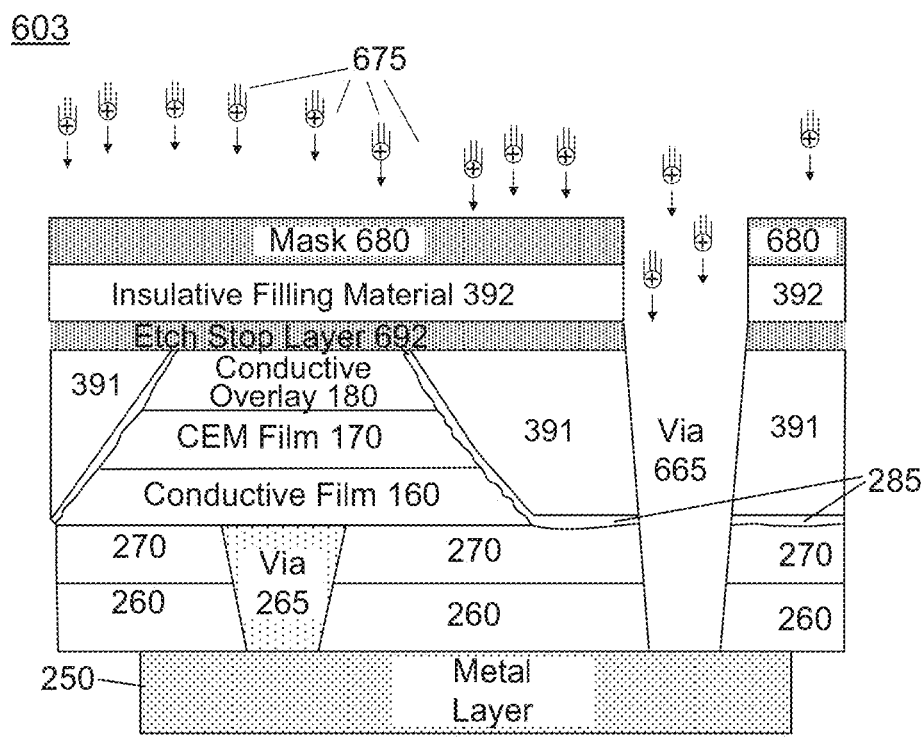

Returning to the sub-processes of FIGS. 6A-6F, as shown in FIG. 6D, via 665 may be formed, for example, utilizing an etching process, such as a dry etch (e.g., reactive ion etch). Here, an etch stop control layer 692 may be formed on an exposed or revealed portion of conductive overlay 180 (e.g., as shown in FIG. 6C) followed by formation of layer 392 of insulative filling material on etch stop control layer 692 (e.g., using deposition as described above in connection with formation of insulative filling material 391), followed by formation of mask layer 680 on layer 392 (e.g., as shown in FIG. 6D). Etching for formation of via 665 may involve use of oxide hardmask 680 and a photoresist layer (not shown in FIG. 6D), which may operate similar to hardmask 280 and photoresist layer 290 described in reference to FIG. 2A. In the embodiment of FIG. 6D, etch process 675 may be utilized to form via 665, for example, within insulative filling material 391. Formation of via 665 may additionally involve etching of, or otherwise removing at least a portion of sealing layer 285, as well as dielectric layer 270 and capping layer 260. In the embodiment of FIG. 6D, etching for formation of via 665 may terminate upon reaching metal layer 250, for example. Layer of 392 of insulative filling material may have a thickness (e.g., in combination with a thickness of etch-stop control layer 692) that is sufficient to provide a useful barrier between conductive overlay 180 and hardmask 680 for an etching process, or allow metal-filled via 665 to extend sufficiently above a top surface of conductive overlay 180. For example, such a thickness of layer of insulative material may have a thickness of between about 5.0 nm to about 50.0 nm.

Figure 6E:
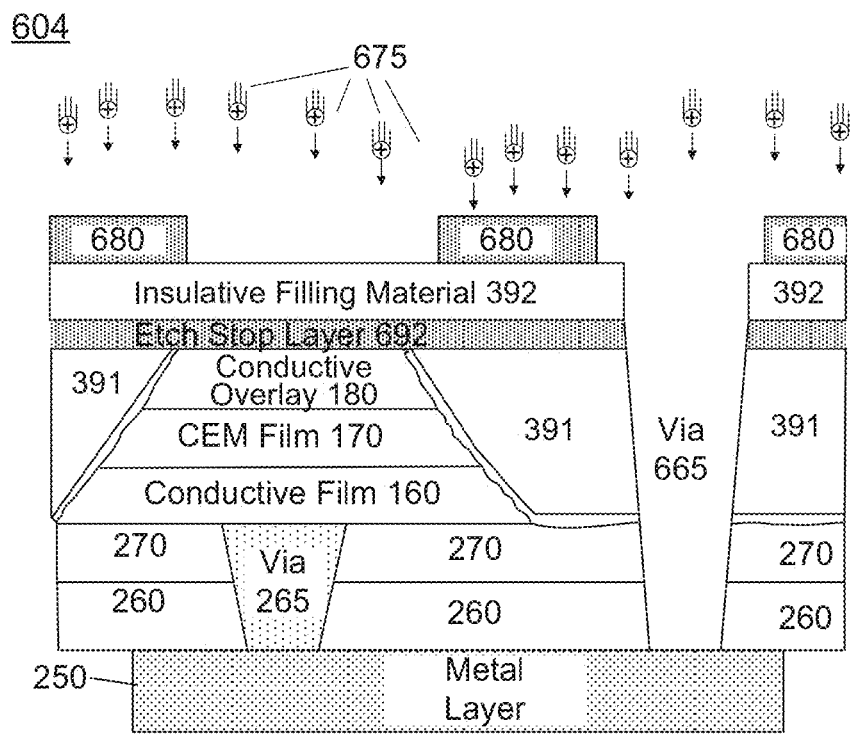

In accordance with FIG. 6E, following etching for formation of via 665, hardmask 680 may be patterned such as, for example, by way of an RIE process involving a photoresist layer. Here, for example, a lithography process may transfer a pattern from a photoresist onto mask 680. An RIE process may expose insulative filling material 392 to a second use of etch process 675, which may be utilized to etch specific regions of insulative filling material 392 to form trenches. In certain embodiments, insulative filling material 392 may comprise a material similar or even identical to insulative filling material 391 and may comprise a thickness of, for example, between about 5.0 nm and about 20.0 nm, and claimed subject matter is not limited in this respect.

Figure 6F:
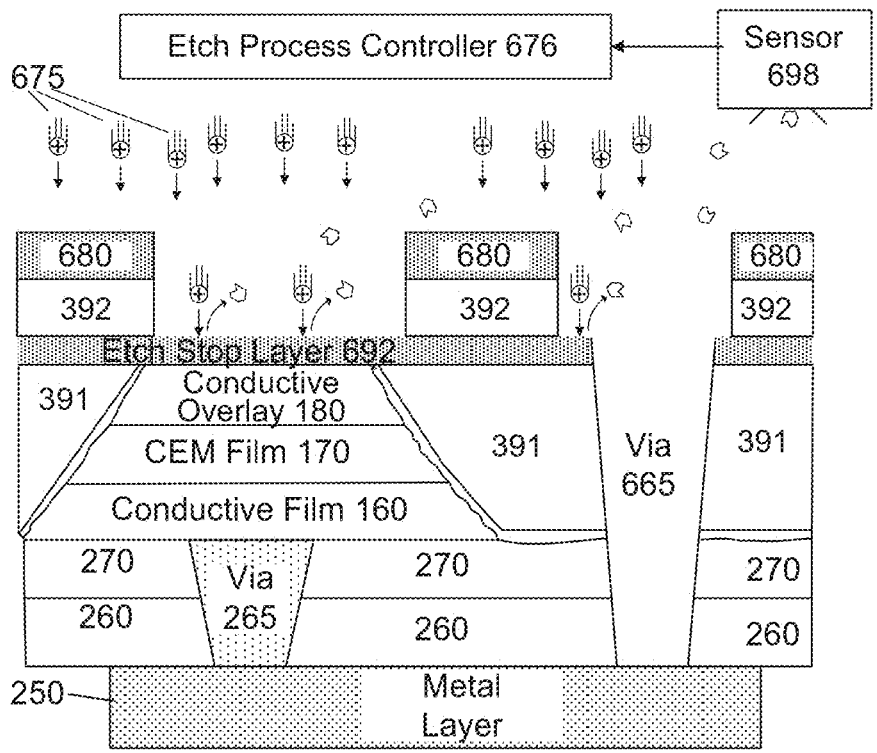

As shown in FIG. 6F, during etch process 675, reactive ions, for example, may ablate regions of insulative filling material 392 until encountering etch-stop control layer 692. In the embodiment of FIG. 6F, etch process 675 may be performed within an etching chamber. Thus, following ablation of a portion of etch-stop control layer 692, such as an upper portion of etch-stop control layer 692, gaseous and/or dissociated molecular and/or atomic components of etch-stop control layer 692 may be detected by sensor 698, which may operate to sample ambient gaseous components present within the etching chamber. Accordingly, responsive to sensor 698 detecting molecular and/or atomic components of etch-stop control layer 692, sensor 698 may signal etch process controller 676 to slow, or even to terminate, etch process 675. Responsive to detection of molecular and/or atomic components of etch-stop control layer 692, sensor 698 may initiate other actions, and claimed subject matter is not limited in this respect.

Following a change in etch process 675 (e.g., slowing or termination of etch process 675) responsive to detection of components of etch-stop control layer 692 at sensor 698, a remaining portion of may continue until a portion of etch-stop control layer 692 may be removed using an "etch through" or "punch through" step to expose or reveal a top surface of conductive overlay 180. Such an "etch through" or "punch through" step may comprise a continuation of etch process 675 for a particular duration or use of a different etch process such as, for example, by using different etch chemistries that have high etch rate on etch stop layer 692 but low etch rate on filling material 391. Such a different etch process may be characterized as imparting a short time pulsing punch through that is targeting to remove the relatively thin etch-stop control layer 692.

Figure 6G:
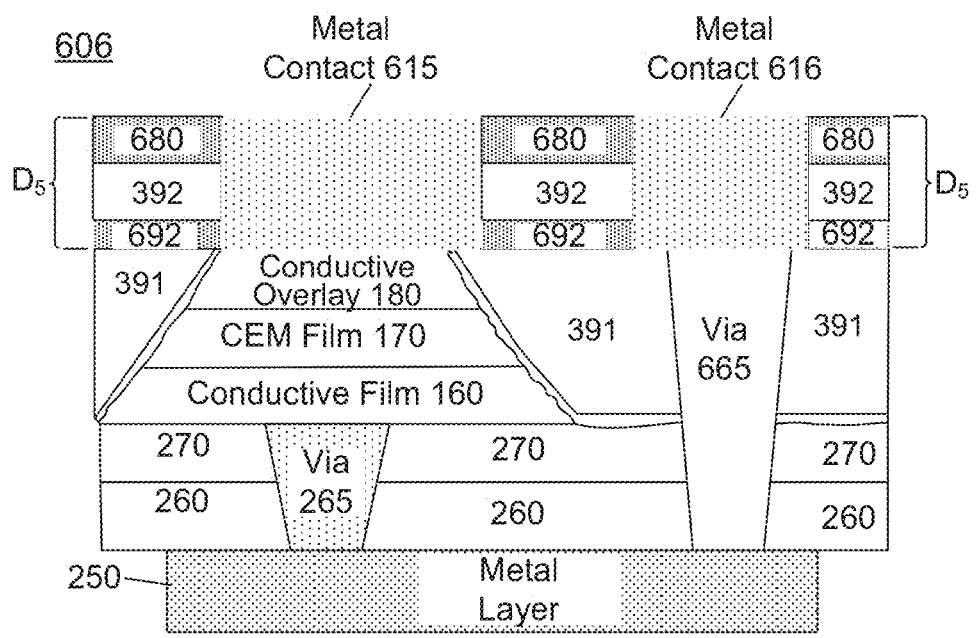

Following removal of etch-stop control layer 692 to expose or reveal a top surface of conductive overlay 180, metal contacts 615 and 616 may be formed by metal deposition so as to make contact with conductive overlay 180 and via 665, as shown in FIG. 6G (embodiment 606). In embodiments, by way of more precise termination of an etching process, such as etch process 675, coplanar metal contacts 615 and/or 616 may be deposited at appropriate depths, such as $D_5$, for example. Accordingly, the device structure formed by conductive overlay 180, CEM film 170, and conductive film 160 may be electrically connected and/or couple to circuitry external to the device structure (not shown).

Figure 7:
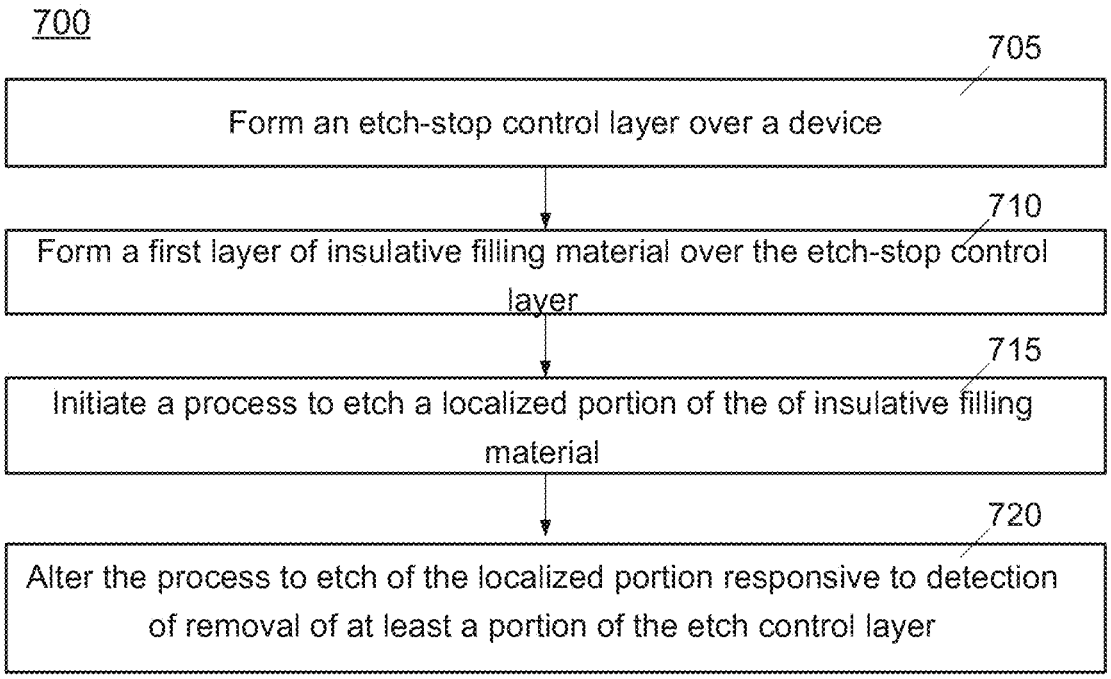
FIGS. 7-8 are flow diagrams illustrating processes of fabricating and/or constructing a CEM switching device utilizing an etch-stop control layer, according to embodiments.
Figure 8:
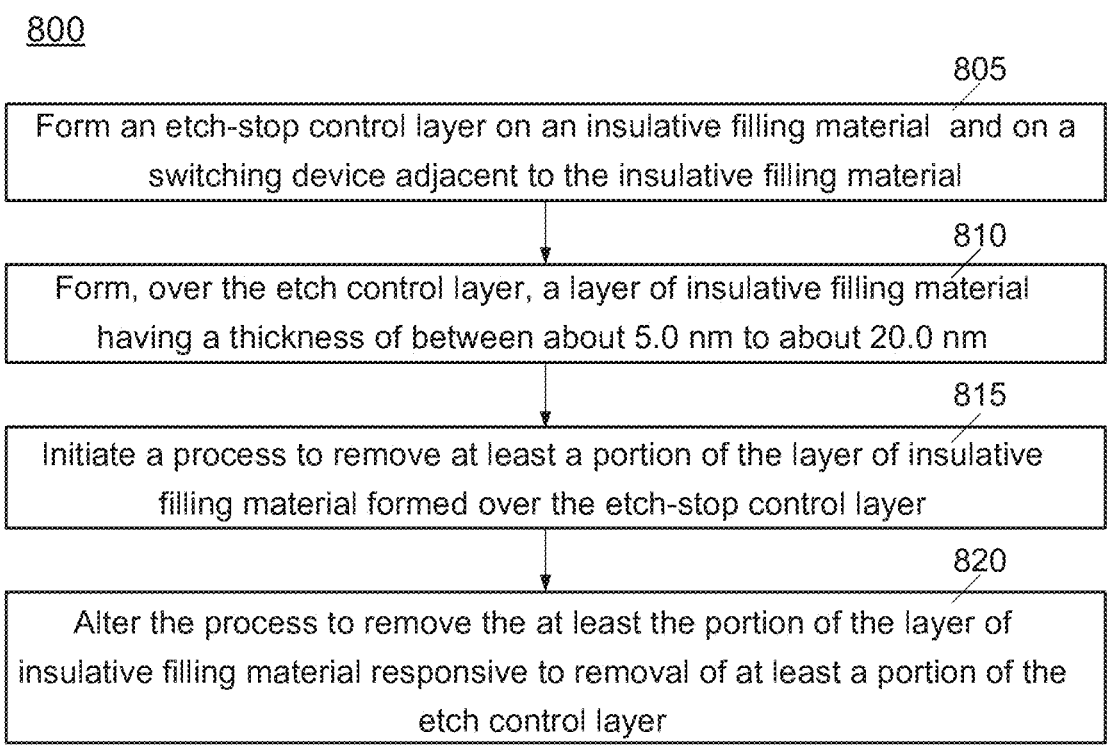

FIGS. 7-8 are flow diagrams illustrating processes of fabricating and/or constructing a CEM switching device utilizing an etch-stop control layer, according to embodiments. The method of FIG. 7 (embodiment 700) may begin at block 705, which may comprise using chemical mechanical polishing (CMP) to polish and stop on conductive overlay top surface, followed by forming an etch-stop control layer over the device. Thus, block 705 may comprise forming or depositing an etch-stop control layer, such as etch-stop control layer 692, for example, over a CEM structure comprising a conductive overlay, a CEM film, and a conductive film, for example, although claimed subject matter may comprise forming or depositing an etch-stop control layer over other types of structures. In a particular implementation, such an etch-stop control layer formed at block 705 may be formed on or over a previously formed layer of insulative material that has been polished to reveal conductive overlay top surface. As such, block 705 may be preceded by depositing insulative filling material over a conductive overlay (e.g., depositing insulative filing material 391 over conductive overlay 180 as shown in FIGS. 6A) and 6B); and removing a portion of the deposited insulative filling material to reveal a top surface of the conductive overlay that is coplanar with a top surface of a remaining portion of the deposited insulative filling material adjacent to the device (e.g., to reveal a top surface of conductive overlay 180 to be coplanar with the top surface of the remaining portion of insulative filing material 391 adjacent to the device formed by conductive overlay 180, CEM film 170 and conductive film 160). Such removal of the portion of portion of the deposited insulative filing material may comprise chemical mechanical polishing. The etch-stop control layer may be formed at block 705 to be disposed over the top surface of the conductive overlay and the remaining portion of the deposited insulative material (e.g., etch-stop control layer 692 to be disposed over the revealed top surface of conductive overlay 180 and the top surface of the remaining portion of the deposited insulative filing material 391 as shown in FIG. 6C).

In embodiments, depositing, for example, an etch-stop control layer may utilize processes such as chemical vapor deposition, plasma chemical vapor deposition, sputter deposition, physical vapor deposition, hot wire chemical vapor deposition, laser enhanced chemical vapor deposition, laser enhanced atomic layer deposition, rapid thermal chemical vapor deposition, spin on deposition, gas cluster ion beam deposition, or the like. In an embodiment, an etch-stop control layer formed at block 705 may comprise at least a substantial atomic or molecular concentration, such as at least 50.0%, of AN, silicon nitride, or other etch control material. An etch-stop control layer deposited at block 705 may comprise a thickness of, for example, between about 1.0 nm and about 50.0 nm.

At block 710, a first layer of an insulative filling material (e.g., layer 392) may be deposited or formed over the etch-stop control layer. Thus, block 710 may comprise disposing a material such as an insulative filling material, such as insulative filling material 391 over an etch-stop control layer. The method may continue at block 715, which may comprise initiating etching of a localized portion of the insulative filling material so as to expose an underlying etch-stop control layer, such as etch-stop control layer 692, described with reference to FIG. 6C. In particular embodiments, etching a localized portion of an insulative filling material may comprise a dry etch process, such as a reactive ion etch, just to name a possible example, and claimed subject matter is not limited in this respect. The method of FIG. 7 may continue at block 720, which may comprise altering an etching process initiated at block 715 responsive to detection of removal, such as by way of an etching process, of at least a portion of the etch-stop control layer. Accordingly, block 720 may comprise utilizing a sensor, which may operate to sample gases present in an etching chamber during an etching process. Responsive to detection of gaseous and/or dissociated molecular and/or atomic components of an etch-stop control layer, an etch process controller (e.g., etch processing controller 676) may alter the etching process initiated at block 715 by, for example, slowing, or terminating entirely, the etching process. Detection of gaseous and/or dissociated molecular and/or atomic components of an etch-stop control layer may give rise to additional actions by an etch controller, and claimed subject matter is not limited in this respect. As pointed out above, following an alteration of an etching process at block 715, a "punch through" etch may be employed to remove a remaining portion of the etch stop control layer formed at block 705 to expose or reveal a conductive overlay (e.g., conductive overlay 180).

The method of FIG. 8 (embodiment 800) begin at block 805, which may comprise forming or depositing an etch-stop control layer on an insulative filling material and on a switching device adjacent to the insulative filling material. Thus, block 805 may comprise depositing an etch-stop control layer on or over a switching device comprising a conductive overlay, a CEM film, and a conductive film under or beneath the CEM film. Block 805 may comprise forming an etch-stop control layer over a layer of insulative filling material, such as insulative filling material 391 described herein. The method may continue at block 810, which may comprise forming a layer of insulative filing material by depositing an insulative filling material. Such a layer may have a thickness of between about 5.0 nm to about 50.0 nm, over the etch-stop control layer formed at block 805. Accordingly, block 810 may comprise depositing, for example, a material similar to insulative filling material 391.

The method may continue at block 815, which may comprise initiating a process to remove at least a portion of the insulative filling material over the etch-stop control layer. Thus, block 815 may comprise initiating a process to perform a dry etch, such as a reactive ion etch, to bring about removal of particular portions the insulative filling material. At block 820, the method of FIG. 8 may comprise altering a process for removing initiated at block 815 such as by slowing or terminating the process for removing initiated at block 815, such as by way of an etching process, of the at least the portion of the insulative filling material responsive to detection of the removal of at least a portion of the etch-stop control layer. Thus, block 820 may comprise an etch process controller (e.g., etch process controller 676) acquiring a signal from a sensor, such as sensor 698 of FIG. 6F, which may sample gases present in an etching chamber during an etching process. Responsive to detection of gaseous and/or dissociated molecular and/or atomic components of an etch-stop control layer, etch process controller 676, for example, may slow, or terminate entirely, an etching process.

A plurality of CEM devices, such as those described herein, may be formed to bring about integrated circuit devices, which may include, for example, a first correlated electron device having a first CEM and a second correlated electron device having a second CEM, wherein the first and second correlated electron materials may comprise substantially dissimilar impedance characteristics that differ from one another. Also, in an embodiment, a first CEM device and a second CEM device, comprising impedance characteristics that differ from one another, may be formed within a particular level of an integrated circuit. Further, in an embodiment, forming the first and second CEM devices within a particular level of an integrated circuit may include forming the CEM devices at least in part by selective epitaxial deposition. In another embodiment, the first and second CEM devices within a particular level of the integrated circuit may be formed at least in part by ion implantation, such as to alter impedance characteristics for the first and/or second CEM devices, for example.

In the preceding description, in a particular context of usage, such as a situation in which tangible components (and/or similarly, tangible materials) are being discussed, a distinction exists between being "on" and being "over." As an example, deposition of a substance "on" a conductive film refers to a deposition involving direct physical and tangible contact without an intermediary, such as an intermediary substance (e.g., an intermediary substance formed during an intervening process operation), between the substance deposited and the conductive film in this latter example; nonetheless, deposition "over" a conductive film, while understood to potentially include deposition "on" a conductive film (since being "on" may also accurately be described as being "over"), is understood to include a situation in which one or more intermediaries, such as one or more intermediary substances, are present between the substance deposited and the conductive film so that the substance deposited is not necessarily in direct physical and tangible contact with the conductive film.

A similar distinction is made in an appropriate particular context of usage, such as in which tangible materials and/or tangible components are discussed, between being "beneath" and being "under." While "beneath," in such a particular context of usage, is intended to necessarily imply physical and tangible contact (similar to "on," as just described), "under" potentially includes a situation in which there is direct physical and tangible contact but does not necessarily imply direct physical and tangible contact, such as if one or more intermediaries, such as one or more intermediary substances, are present. Thus, "on" is understood to mean "immediately over" and "beneath" is understood to mean "immediately under."

It is likewise appreciated that terms such as "over" and "under" are understood in a similar manner as the terms "up," "down," "top," "bottom," and so on, previously mentioned. These terms may be used to facilitate discussion but are not intended to necessarily restrict scope of claimed subject matter. For example, the term "over," as an example, is not meant to suggest that claim scope is limited to only situations in which an embodiment is right side up, such as in comparison with the embodiment being upside down, for example. An example includes a flip chip, as one illustration, in which, for example, orientation at various times (e.g., during fabrication) may not necessarily correspond to orientation of a final product. Thus, if an object, as an example, is within applicable claim scope in a particular orientation, such as upside down, as one example, likewise, it is intended that the latter also be interpreted to be included within applicable claim scope in another orientation, such as right side up, again, as an example, and vice-versa, even if applicable literal claim language has the potential to be interpreted otherwise. Of course, again, as always has been the case in the specification of a patent application, particular context of description and/or usage provides helpful guidance regarding reasonable inferences to be drawn.

Unless otherwise indicated, in the context of the present disclosure, the term "or" if used to associate a list, such as A, B, or C, is intended to mean A, B, and C, here used in the inclusive sense, as well as A, B, or C, here used in the exclusive sense. With this understanding, "and" is used in the inclusive sense and intended to mean A, B, and C; whereas "and/or" can be used in an abundance of caution to make clear that all of the foregoing meanings are intended, although such usage is not required. In addition, the term "one or more" and/or similar terms is used to describe any feature, structure, characteristic, and/or the like in the singular, "and/or" is also used to describe a plurality and/or some other combination of features, structures, characteristics, and/or the like. Furthermore, the terms "first," "second," "third," and the like are used to distinguish different aspects, such as different components, as one example, rather than supplying a numerical limit or suggesting a particular order, unless expressly indicated otherwise. Likewise, the term "based on" and/or similar terms are understood as not necessarily intending to convey an exhaustive list of factors, but to allow for existence of additional factors not necessarily expressly described.

Furthermore, it is intended, for a situation that relates to implementation of claimed subject matter and is subject to testing, measurement, and/or specification regarding degree, to be understood in the following manner. As an example, in a given situation, assume a value of a physical property is to be measured. If alternatively reasonable approaches to testing, measurement, and/or specification regarding degree, at least with respect to the property, continuing with the example, is reasonably likely to occur to one of ordinary skill, at least for implementation purposes, claimed subject matter is intended to cover those alternatively reasonable approaches unless otherwise expressly indicated. As an example, if a plot of measurements over a region is produced and implementation of claimed subject matter refers to employing a measurement of slope over the region, but a variety of reasonable and alternative techniques to estimate the slope over that region exist, claimed subject matter is intended to cover those reasonable alternative techniques, even if those reasonable alternative techniques do not provide identical values, identical measurements or identical results, unless otherwise expressly indicated.

It is further noted that the terms "type" and/or "like," if used, such as with a feature, structure, characteristic, and/or the like, using "optical" or "electrical" as simple examples, means at least partially of and/or relating to the feature, structure, characteristic, and/or the like in such a way that presence of minor variations, even variations that might otherwise not be considered fully consistent with the feature, structure, characteristic, and/or the like, do not in general prevent the feature, structure, characteristic, and/or the like from being of a "type" and/or being "like," (such as being an "optical-type" or being "optical-like," for example) if the minor variations are sufficiently minor so that the feature, structure, characteristic, and/or the like would still be considered to be predominantly present with such variations also present. Thus, continuing with this example, the terms optical-type and/or optical-like properties are necessarily intended to include optical properties. Likewise, the terms electrical-type and/or electrical-like properties, as another example, are necessarily intended to include electrical properties. It should be noted that the specification of the present disclosure merely provides one or more illustrative examples and claimed subject matter is intended to not be limited to one or more illustrative examples; however, again, as has always been the case with respect to the specification of a patent application, particular context of description and/or usage provides helpful guidance regarding reasonable inferences to be drawn.

In the preceding description, various aspects of claimed subject matter have been described. For purposes of explanation, specifics, such as amounts, systems, and/or configurations, as examples, were set forth. In other instances, well-known features were omitted and/or simplified so as not to obscure claimed subject matter. While certain features have been illustrated and/or described herein, many modifications, substitutions, changes, and/or equivalents will occur to those skilled in the art. It is, therefore, to be understood that the appended claims are intended to cover all modifications and/or changes as fall within claimed subject matter.

What is claimed is:

1. A method comprising:
    forming a structure on a first portion of a substrate while maintaining a second portion of the substrate exposed, the structure comprising at least a conductive film formed on the substrate and a correlated electron material (CEM) film formed over the conductive film;
    depositing a sealing layer over the structure and at least a portion of the second portion of the substrate;
    forming a first layer of insulative filling material over at least a portion of the sealing layer disposed over the second portion of the substrate; and
    removing a portion of the first layer of insulative filling material prior to removal of the at least a portion of the sealing layer disposed over the second portion of the substrate.

2. The method of claim 1, further comprising forming a metal via filling the removed portion of the sealing layer to extend from an exposed metal layer to a metal layer disposed under the substrate.

3. The method of claim 1, wherein the removing of the portion of the sealing layer to expose the metal layer comprises performing a dry etch to remove the portion of the sealing layer.

4. The method of claim 3, wherein the dry etch comprises reactive ion etching.

5. The method of claim 3, wherein the dry etch comprises plasma sputter etch.

6. The method of claim 1, wherein the portion of the first layer of insulative filling material and the at least a portion of the sealing layer disposed over the second portion of the substrate are removed in a single etch process step to form a trench, and the method further comprises:
    depositing a metal in the trench to form a metal via extending from an exposed metal layer to a metal layer disposed under the substrate.

7. The method of claim 1, wherein the sealing layer comprises an atomic or molecular concentration of at least 50.0% silicon nitride, silicon carbide or silicon carbon nitride, or any combination thereof.

8. The method of claim 1, wherein the sealing layer comprises a thickness of between about 2.0 nm and about 100.0 nm.

9. The method of claim 1, and further comprising:
forming the conductive film over a metal layer;
depositing one or more layers of CEM on the conductive film to form the CEM film;
forming a conductive overlay over the CEM film; and
removing a portion of the one or more layers of CEM film, a portion of the conductive overlay and a portion of the conductive film to expose the second portion of the substrate.

10. The method of claim 1, wherein removing the portion of the first layer of insulative filling material prior to removal of the at least a portion of the sealing layer disposed over the second portion of the substrate further comprises: forming an etch-stop control layer over the first layer of insulative filling material; forming a second layer of insulative filling material over the etch-stop control layer; initiating a process to etch a localized portion of the second layer of insulative filling material; and altering the process to etch the localized portion responsive to detection of removal of at least a portion of the etch-stop control layer.

11. The method of claim 10, wherein the structure further comprises a conductive overlay layer, the method further comprising, prior to the forming of the etch-stop control layer; removing a portion of the first layer of insulative filling material formed over the conductive overlay layer to reveal a top surface of the conductive overlay that is coplanar with a top surface of a remaining portion of the first layer of insulative filling material adjacent to the structure, wherein the etch-stop control layer is formed over the top surface of the conductive overlay and the remaining portion of the first layer of insulative filling material.

12. The method of claim 11, wherein removing the portion of the first layer of insulative filling material formed over the conductive overlay layer to reveal the top surface of the conductive overlay comprises chemical mechanical polishing to planarize the top surface of the conductive overlay and the top surface of the remaining portion of the first layer of insulative filling material.

13. The method of claim 10, wherein the etch-stop control layer is formed over a conductive overlay, and the method further comprises:
continuing the altered process to etch the localized portion until at least a portion of the conductive overlay is revealed.

14. The method of claim 10, wherein the first layer of insulative filling material comprises an insulative filling material having a relative dielectric constant of between about 2.0 and about 4.5.

15. The method of claim 10, wherein the etch-stop control layer comprises an atomic or molecular concentration of at least 50.0% silicon nitride or aluminum nitride, or combination thereof.

16. The method of claim 10, further comprising terminating the etching responsive to sensing one or more gaseous components of the etch-stop control layer in a chamber.

17. The method of claim 10, wherein the etch-stop control layer comprises a thickness of between about 1.0 nm and about 50.0 nm.

18. The method of claim 10, further comprising depositing a metal on the conductive overlay following the terminating of the etching of the localized portion.

19. The method of claim 1, wherein removing the portion of the first layer of insulative filling material prior to removal of the at least a portion of the sealing layer disposed over the second portion of the substrate further comprises:
forming an etch-stop control layer over the first layer of insulative filling material and over the structure;
forming, over the etch-stop control layer, a second layer of insulative filling material having a thickness of between about 5.0 nm to about 20.0 nm;
initiating a process to remove at least a portion of the second layer of insulative filling material formed over the etch-stop control layer; and
altering the process to remove the at least the portion of the second layer of insulative filling material responsive to removal of at least a portion of the etch-stop control layer.

20. The method of claim 19, further comprising depositing a hardmask over the second layer of insulative filling material prior to the removing of the at least a portion of the second layer of insulative filling material.

21. The method of claim 20, wherein the altering the process to remove the at least the portion of the second layer of insulative filling material occurs responsive to detecting one or more gaseous components of the etch-stop control layer in a chamber.

22. The method of claim 19, wherein the etch-stop control layer comprises a thickness of between about 1.0 nm and about 50.0 nm.

* * * * *